(12) United States Patent
Cho et al.

(10) Patent No.: US 7,646,664 B2
(45) Date of Patent: Jan. 12, 2010

(54) SEMICONDUCTOR DEVICE WITH THREE-DIMENSIONAL ARRAY STRUCTURE

(75) Inventors: Hoo-Sung Cho, Gyeonggi-do (KR);
Soon-Moon Jung, Gyeonggi-do (KR);
Young-Seop Rah, Gyeonggi-do (KR);
Jae-Hoon Jang, Gyeonggi-do (KR);
Jae-Hun Jeong, Gyeonggi-do (KR);
Jun-Beom Park, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 8 days.

(21) Appl. No.: 11/869,140

(22) Filed: Oct. 9, 2007

(65) Prior Publication Data
US 2008/0084729 A1   Apr. 10, 2008

(30) Foreign Application Priority Data
Oct. 9, 2006   (KR) ...................... 10-2006-0098061
Mar. 12, 2007   (KR) ...................... 10-2007-0024088
Jun. 14, 2007   (KR) ...................... 10-2007-0058411

(51) Int. Cl.
*G11C 8/00* (2006.01)

(52) U.S. Cl. .................... 365/230.06; 365/63; 365/214; 365/230.03

(58) Field of Classification Search .................. 365/214
See application file for complete search history.

(56) References Cited

U.S. PATENT DOCUMENTS 5,291,440 A   3/1994   Koyama
5,828,113 A * 10/1998   Chen et al. .................. 257/391
5,835,396 A   11/1998   Zhang
6,034,882 A   3/2000   Johnson et al.
6,879,505 B2 * 4/2005   Scheuerlein ................. 365/51
7,002,825 B2   2/2006   Scheuerlein
2006/0108627 A1   5/2006   Choi et al.

FOREIGN PATENT DOCUMENTS

JP       05-036942        2/1993
JP       2002-368141     12/2002
KR     1020060057821 A    5/2006
KR    10-2006-0098044 A   9/2006

* cited by examiner

*Primary Examiner*—Tan T. Nguyen
(74) *Attorney, Agent, or Firm*—Myers Bigel Sibley & Sajovec, P.A.

(57) ABSTRACT

A semiconductor memory device including a memory cell array, a first row decoder adjacent the memory cell array, and a second row decoder adjacent the memory cell array. A memory cell array may include first and second memory cell blocks on respective first and second semiconductor layers. The first memory cell block may include a first word line coupled to a first row of memory cells on the first semiconductor layer, the second memory cell block may include a second word line coupled to a second row of memory cells on the second semiconductor layer, and the first word line may be between the first and second semiconductor layers. The first row decoder may be configured to control the first word line, and the second row decoder may be configured to control the second word line. A first wiring may electrically connect the first row decoder and the first word line, and a second wiring may electrically connect the second row decoder and the second word line.

24 Claims, 35 Drawing Sheets

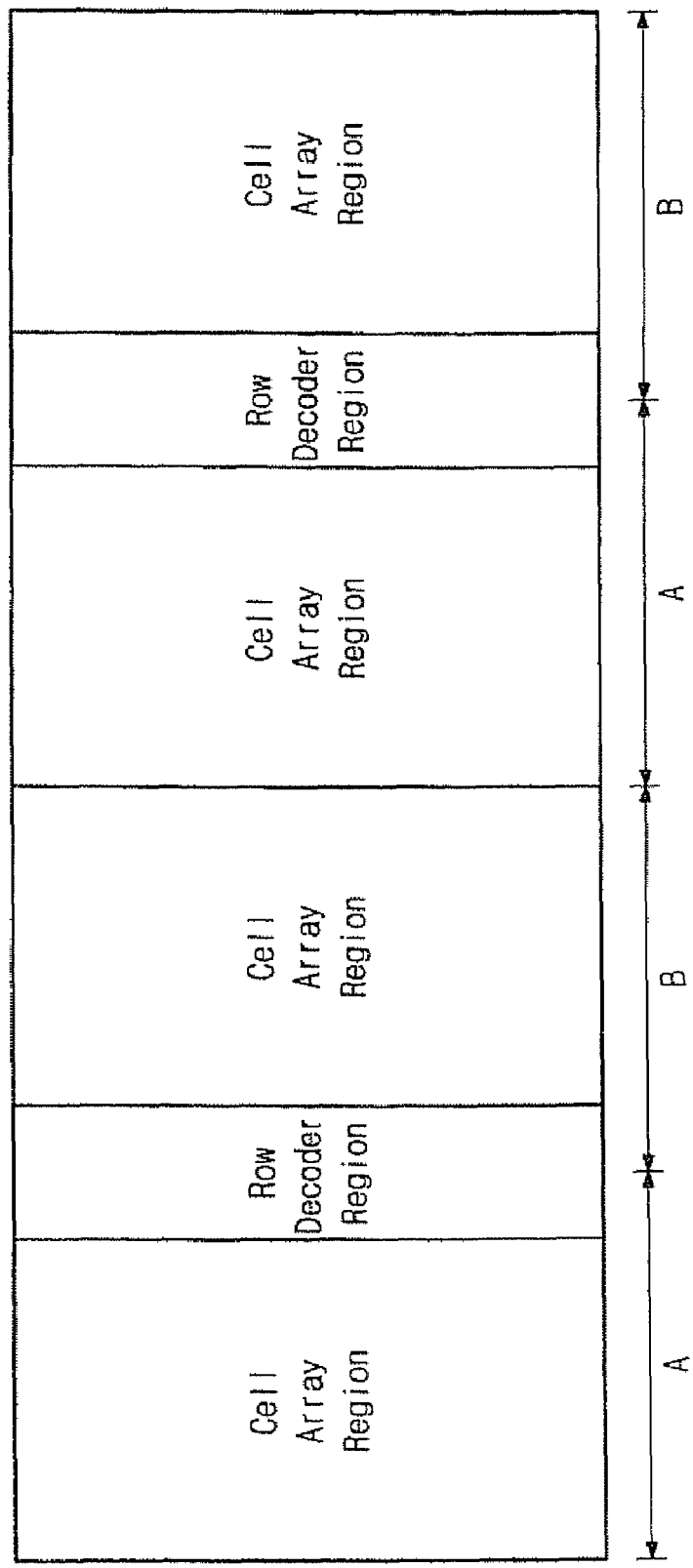

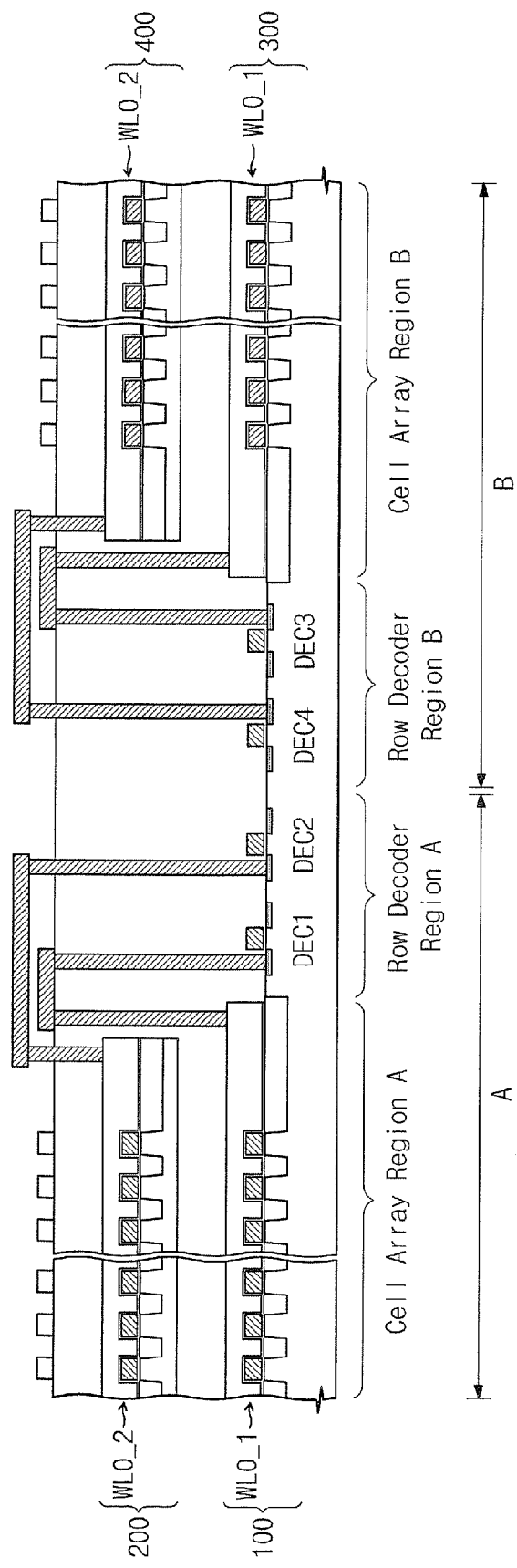

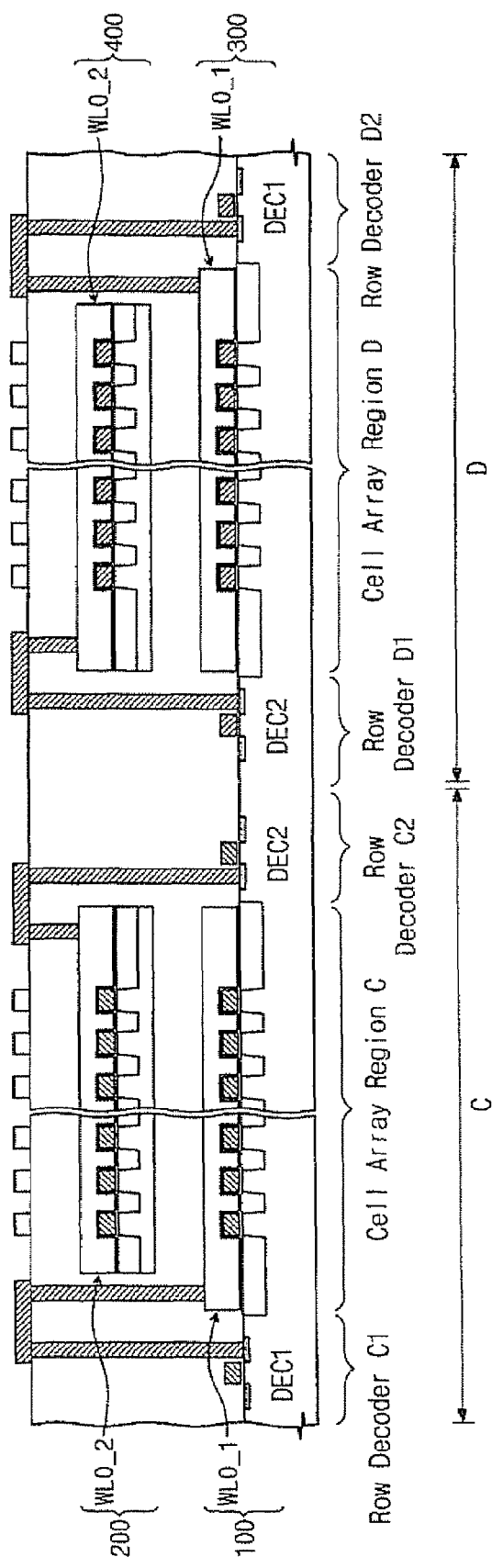

SEMICONDUCTOR DEVICE WITH THREE-DIMENSIONAL ARRAY STRUCTURE

RELATED APPLICATIONS

This U.S. non-provisional patent application claims the benefit of priority under 35 U.S.C. §119 of: Korean Patent Application No. 10-2006-98061, filed on Oct. 9, 2006; Korean Patent Application No. 10-2007-24088, filed on Mar. 12, 2007; and Korean Patent Application No. 10-2007-58411, filed on Jun. 14, 2007. The disclosures of each of the above referenced applications are hereby incorporated herein in their entirety by reference.

BACKGROUND

The present invention disclosed herein relates to semiconductor devices, and more particularly, to semiconductor devices with three-dimensional structures.

With developments of semiconductor manufacturing technology, the demand for a high density memory has increased. Various methods have been suggested to satisfy the demand. One method is to provide a semiconductor device with a three-dimensional array structure. Technologies providing semiconductor devices with three-dimensional structures are disclosed, for example, in U.S. Pat. No. 5,835,396 titled "THREE-DIMENSIONAL READ-ONLY MEMORY," U.S. Pat. No. 6,034,882 titled "VERTICALLY STACKED FIELD PROGRAMMABLE NONVOLATILE MEMORY AND METHOD OF FABRICATION," and U.S. Pat. No. 7,002,825 titled "WORD LINE ARRANGEMENT HAVING SEGMENTED WORD LINES." The disclosures of each of the above-referenced patents are hereby incorporated herein in their entirety by reference.

A semiconductor device with a three-dimensional structure may include memory cell arrays formed in respective semiconductor layers. The semiconductor layers may include a silicon substrate and semiconductor layers that are sequentially stacked on the silicon substrate. The stacked semiconductor layers may be formed using selective epitaxial technology. An example of a semiconductor device with a stacked structure is a flash memory device. Since the flash memory device includes a plurality of word lines, a row decoder may be required to control the respective word lines.

SUMMARY

According to some embodiments of the present invention, a semiconductor memory device may include a memory cell array, first and second row decoders, and first and second wirings. The memory cell array may include first and second memory cell blocks on respective first and second semiconductor layers. The first memory cell block may include a first word line coupled to a first row of memory cells on the first semiconductor layer, the second memory cell block may include a second word line coupled to a second row of memory cells on the second semiconductor layer, and the first word line may be between the first and second semiconductor layers. The first row decoder may be adjacent the memory cell array, and the first row decoder may be configured to control the first word line. The second row decoder may be adjacent the memory cell array, and the second row decoder may be configured to control the second word line. The first wiring may electrically connect the first row decoder and the first word line, and the second wiring may electrically connect the second row decoder and the second word line.

According to other embodiments of the present invention, a semiconductor memory device may include a memory cell array, odd and even row decoders adjacent the memory cell array, and first and second wirings. The memory cell array may include a memory cell block, and the memory cell block may include a first word line coupled to a first row of memory cells and a second word line coupled to a second row of memory cells. Moreover, the first word line may be between the first and second semiconductor layers. The odd row decoder may be configured to control the first word line, the even row decoder may be configured to control the second word line, and the memory cell array may be between the odd and even row decoders. The first wiring may electrically connect the odd row decoder and the first word line, and the second wiring may electrically connect the even row decoder and the second word line.

According to still other embodiments of the present invention, a semiconductor memory device may include a memory cell array, a row decoder, and a wiring. The memory cell array may include first and second memory cell blocks on respective first and second semiconductor layers. The first memory cell block may include a first word line coupled to a first row of memory cells on the first semiconductor layer, the second memory cell block may include a second word line coupled to a second row of memory cells on the second semiconductor layer, and the first word line may be between the first and second semiconductor layers. The row decoder may be adjacent the memory cell array, and the row decoder may be configured to control the first and second word lines. The wiring may electrically connect the first and second word lines and may electrically connect the first and second word lines with the row decoder.

Some embodiments of the present invention may provide semiconductor devices including a cell array region having a first cell block and a second cell block. The first cell block may have a first gate line in a first layer, and the second cell block may have a second gate line in a second layer above the first layer. A row decoder region may be provided adjacent the cell array region, and the row decoder may include a first row decoder controlling the first gate line and a second row decoder controlling the second gate line. A first wiring may connect the first gate line with the first row decoder, and a second wiring may connect the second gate line with the second row decoder.

In some embodiments, the first row decoder may include a first odd row decoder controlling a first odd gate line, and a first even row decoder controlling a first even gate line. The second row decoder may include a second odd row decoder controlling a second odd gate line and a second even row decoder controlling a second even gate line. The first odd row decoder and the first even row decoder may be provided on opposite sides of the cell array region, and the second odd row decoder and the second even row decoder may be provided on opposite sides of the cell array region.

In other embodiments, the first even row decoder and the second odd row decoder may be provided on one side of the cell array region, and the first odd row decoder and the second even row decoder may be provided on the other side of the cell array region. The first even row decoder and the second even row decoder may be provided on one side of the cell array region, and the first odd row decoder and the second odd row decoder may be provided on the other side of the cell array region.

In other embodiments of the present invention, semiconductor devices may include a cell array region having a first cell block with a first gate line in a first layer, and a second cell block with a second gate line in a second layer above the first layer. A wiring may be commonly connected to the first gate line and the second gate line, and a row decoder may be provided adjacent to the cell array region, and the row decoder may simultaneously select the first gate line and the second gate line through the wiring for control.

BRIEF DESCRIPTION OF THE FIGURES

The accompanying figures are included to provide a further understanding of embodiments of the present invention, and are incorporated in and constitute a part of this specification. The drawings illustrate embodiments of the present invention and, together with the description, serve to explain principles of embodiments of the present invention. In the figures:

FIG. 2 is a view of a row decoder arrangement in a semiconductor device having a three dimensional structure according to some embodiments of the present invention;

FIGS. 15B, 16B, and 17B are cross-sectional views taken along lines I-I' of FIGS. 15A, 16A, and 17A, respectively.

DETAILED DESCRIPTION

Figure 1:
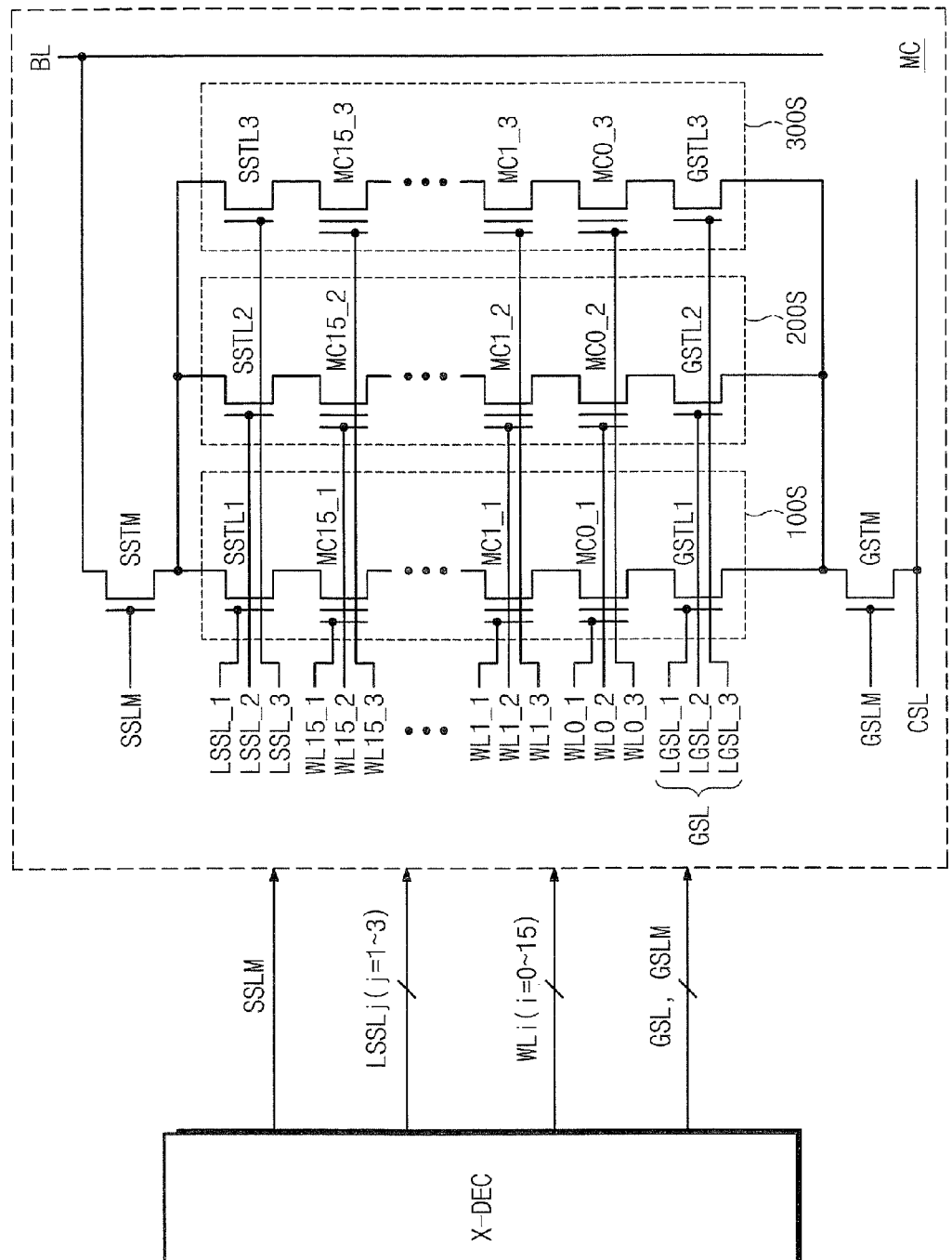
FIG. 1 is a block diagram of a semiconductor device having a three-dimensional structure according to embodiments of the present invention.

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially parallel with respect to a surface of a substrate, and "vertical" refers to a direction that is substantially orthogonal with respect to a surface of a substrate.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein.

Semiconductor devices with three-dimensional structures according to embodiments of the present invention may include flash memory arrays, read only memory arrays, or static random access memory arrays. Flash memory arrays with floating gates are described by way of example.

A flash memory array according to embodiments of the present invention may include a plurality of stacked semiconductor layers, which are used to form memory cells. Although three semiconductor layers (i.e., a first semiconductor layer, a second semiconductor layer, and a third semiconductor layer) are illustrated for a convenient description of embodiments of the present invention, a number of semiconductor layers may be two or four or more.

FIG. 1 is a block diagram of a semiconductor device having a three-dimensional structure according to embodiments of the present invention.

Strings 100S, 200S, and 300S of a memory cell array may be provided on respective semiconductor layers. A plurality of strings may be provided on each semiconductor layer but only one string at each semiconductor layer is illustrated in FIG. 1 for the sake of conciseness. Strings at each of the semiconductor layers may be arranged vertically in the arrangement of FIG. 1. Each string includes a string select transistor, a ground select transistor, and a plurality of memory cells connected in series therebetween. For example, string 100S on a first semiconductor layer may include a first string select transistor SSTL1, a first ground select transistor GSTL1, and a plurality of memory cells MC0_1 to MC15_1 connected in series therebetween. String 200S on a second semiconductor layer may include a second string select transistor SSTL2, a second ground select transistor GSTL2, and a plurality of memory cells MC0_2 to MC15_2 connected in series therebetween. String 300S on a third semiconductor layer may include a third string select transistor SSTL3, a third ground select transistor GSTL3, and a plurality of memory cells MC0_3 to MC15_3 connected in series therebetween.

Memory cells MCi_j and string select transistors SSTLj at each layer may be respectively controlled by select signals WLi and LSSLj generated by row decoder X-DEC corresponding thereto. In contrast, ground select transistors GSTLj may be commonly controlled by one select signal GSL generated by row decoder X-DEC. The structure of FIG. 1 including three semiconductor layers and 16 memory cells in each string will be used to explain embodiments of the present invention. That is, $0 \leq i \leq 15$ and $1 \leq j \leq 3$.

Drains of string select transistors SSTL1, SSTL2, and SSTL3 may be commonly connected to each other. The drains may be electrically connected to a source of a main string select transistor SSTM, and a drain of main string select transistor SSTM may be electrically connected to a bit line BL. Sources of ground select transistors GSTL1, GSTL2, and GSTL3 may be commonly connected to each other and may be electrically connected to a drain of a main ground select transistor GSTM. A source of main ground select transistor GSTM may be electrically connected to a common source line CSL. Main string select transistor SSTM and main ground select transistor GSTM may be provided on one of a first semiconductor layer 102, a second semiconductor layer 202, and a third semiconductor layer 302.

The semiconductor device of FIG. 1 includes a memory cell array region MC and a row decoder region X-DEC adjacent to memory cell array region MC. FIG. 2 is a view of a row decoder arrangement in a semiconductor device with a three dimensional structure according to some embodiments of the present invention. Referring to FIG. 2, a pair of cell array regions may be adjacently arranged and a row decoder region may be provided on one side of each cell array region in the memory cell array region. That is, a region type A may include one cell array region and one row decoder region that are adjacently disposed on one side of the one cell array region. A region type B may have a structure that has mirrored symmetry with respect to that of region A. Region types A and B may be arranged repeatedly.

Figure 3A:
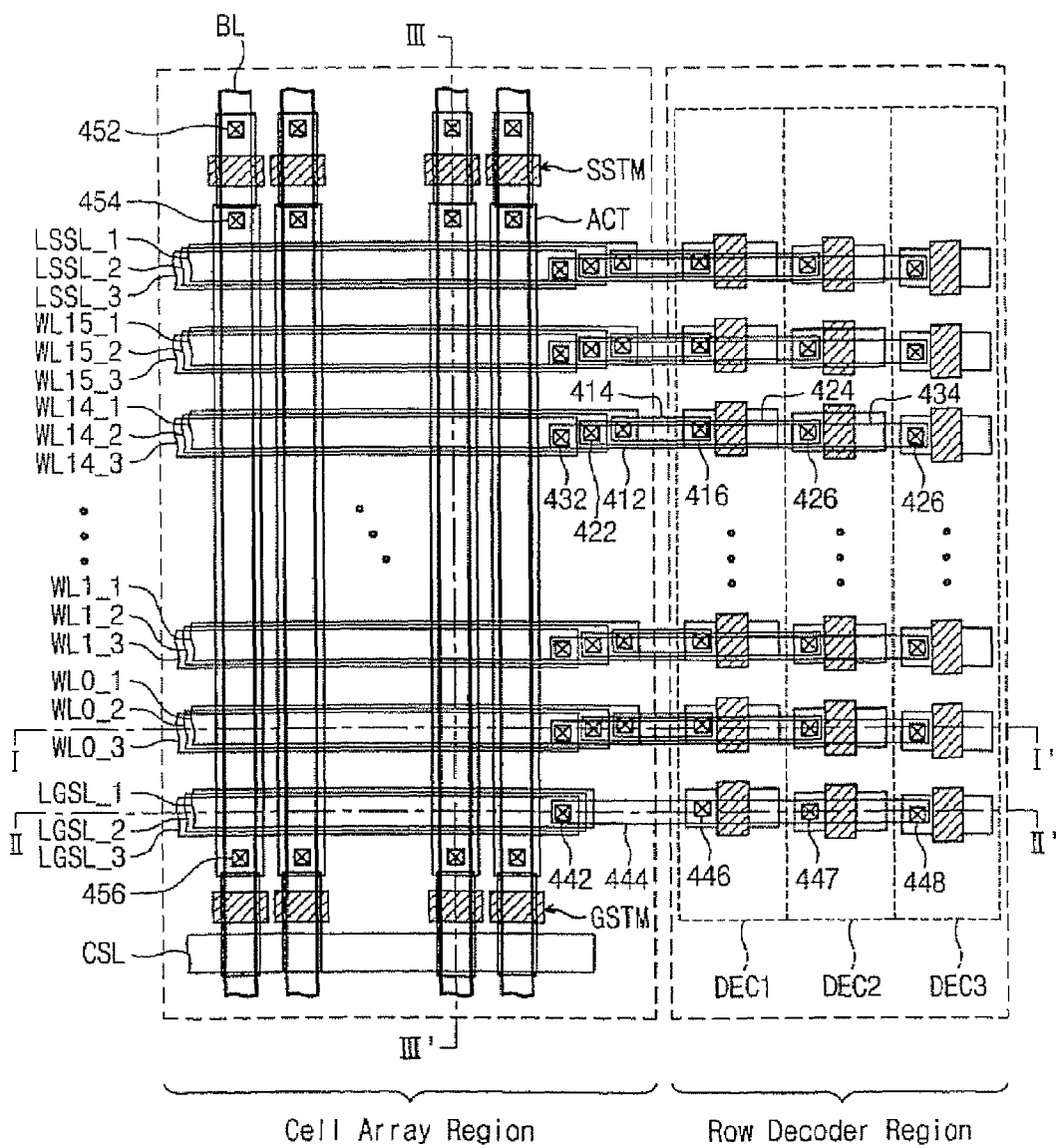
FIG. 3A a layout view of the semiconductor device with a three dimensional structure of FIG. 2.
Figure 3B:
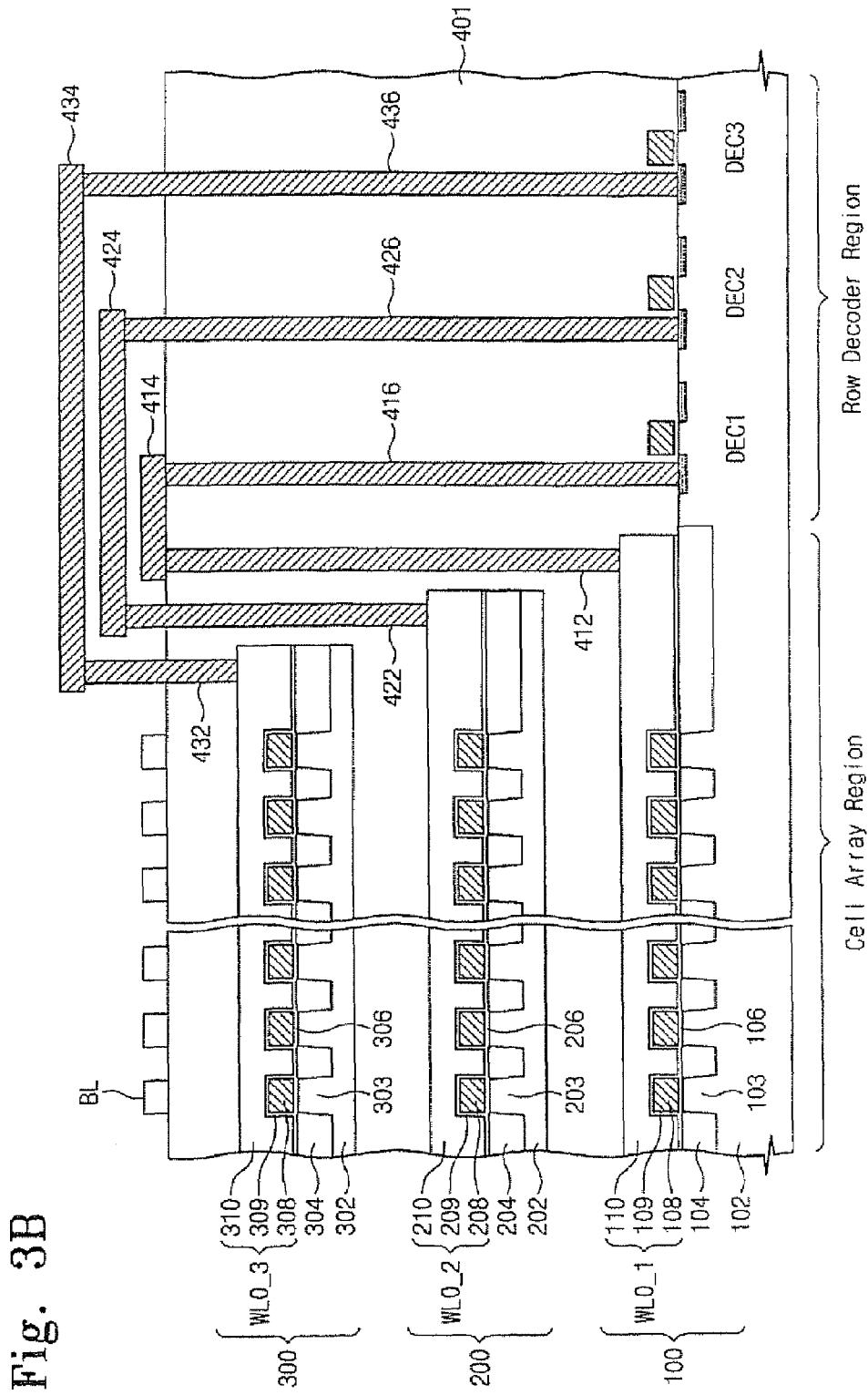
FIGS. 3B, 3C, and 3D are cross-sectional views taken along lines I-I', II-II', and III-III' of FIG. 3A, respectively.
Figure 3C:
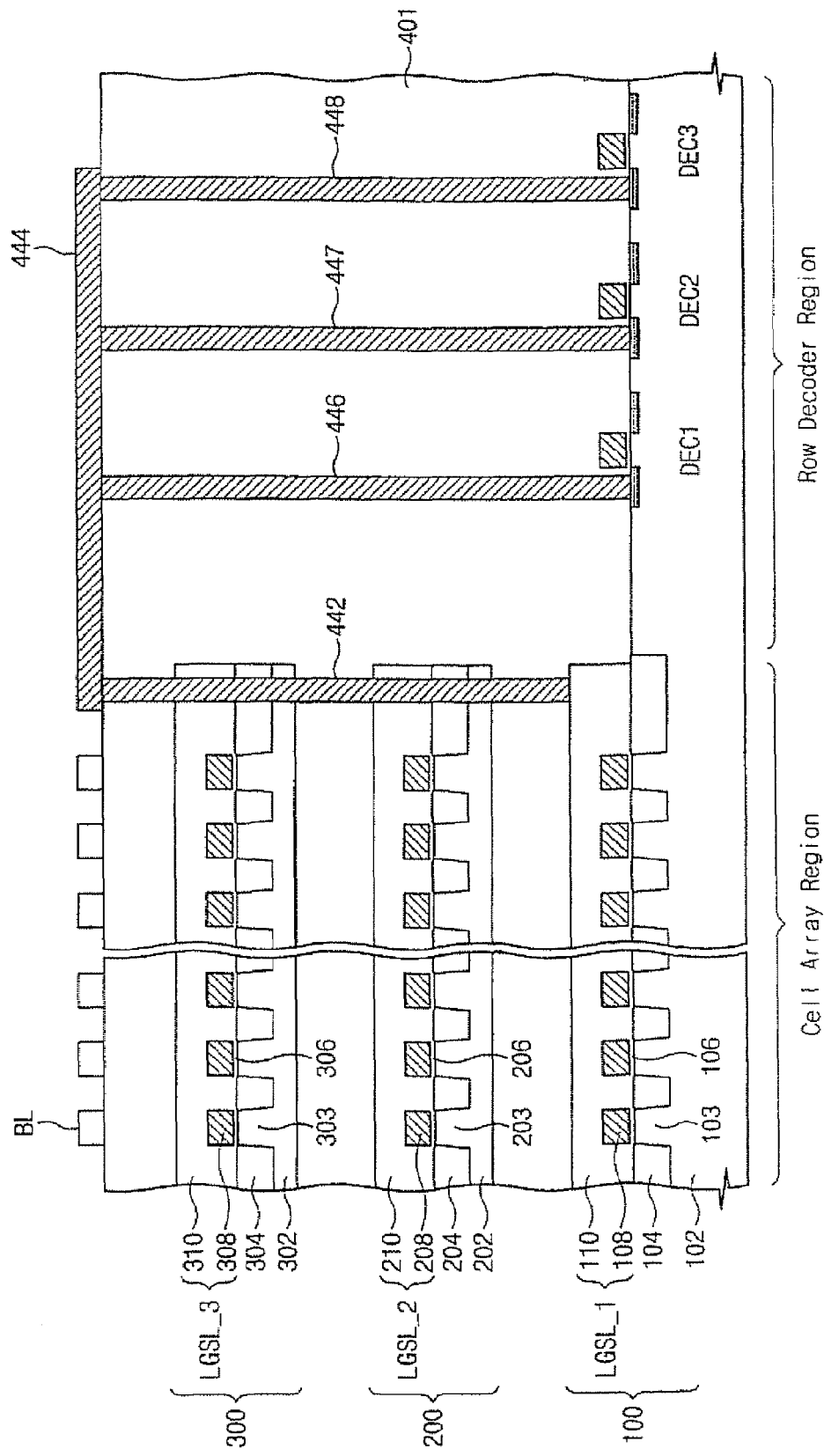
Figure 3D:
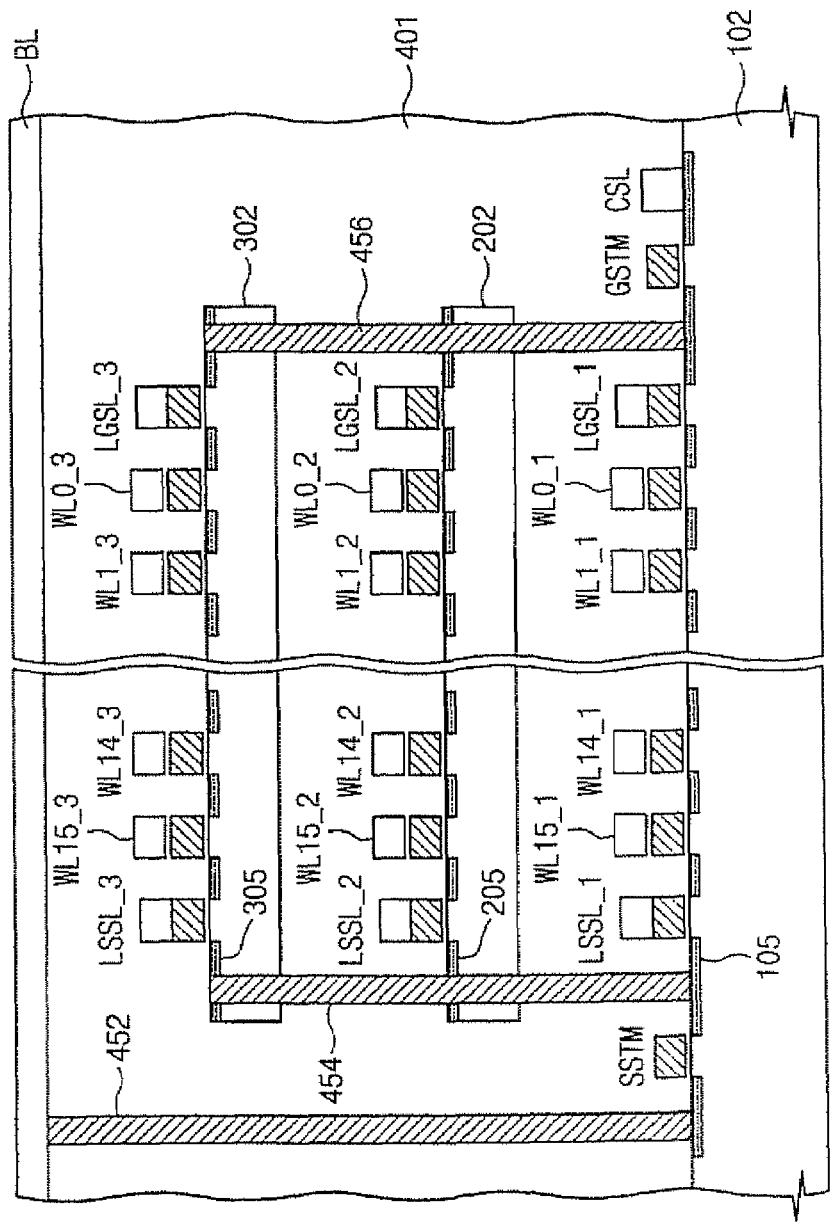

FIG. 3A is illustrates a layout of the semiconductor device with a three dimensional structure of FIG. 2. Only one region type A of FIG. 2 is illustrated. FIGS. 3B, 3C, and 3D are cross-sectional views taken along lines I-I', II-II', and III-III' of FIG. 3A, respectively. A cell array and adjacent row decoder of region type A are illustrated in FIGS. 3B, 3C, and 3D.

According to embodiments of the present invention, first semiconductor layer 102 may be a single crystal silicon wafer. Second semiconductor layer 202 and third semiconductor layer 302 may be single crystal silicon epitaxial layers, which are formed by epitaxial silicon deposition using the first semiconductor layer as a seed. Referring to FIGS. 3A through 3D, semiconductor layers 102, 202, and 302 may include respective active regions 103, 203, and 303 extending along a first direction (e.g., a bit line direction) and device isolation patterns 104, 204, and 304 defining active regions and extending along a second direction (e.g., a word line direction). Device isolation patterns may be formed using a known device isolation process, e.g., a shallow trench device isolation (STI) process.

Gate lines cross over active regions 103, 203, and 303 and extend along the second direction on semiconductor layers 102, 202, and 302. Gate lines may include string select lines LSSL_j, ground select lines LGSL_j, and word lines WLi_j therebetween. LSSL_j represents a string select line of a $j^{th}$ semiconductor layer. WLi_j represents an $i^{th}$ word line of a $j^{th}$ semiconductor layer. LGSL_j represents a ground select line of a $j^{th}$ semiconductor layer. For a convenient description, a string select line, a ground select line, and a word line of a $j^{th}$ semiconductor layer may be referred to as a $j^{th}$ gate line. For example, a string select line LSSL_1, a ground select line LGSL_1, and word lines WLi_1 therebetween of first semiconductor layer 102 may be referred to as first gate lines. Memory cell transistors may include respective charge storage layers 108, 208, and 308, dielectric layers 109, 209, and 309, and gate electrodes 110, 210, and 310. Select lines may include respective portions of charge storage layers 108, 208, and 308, electrically coupled to respective gate electrodes 110, 210, and 310. Charge storage layers may, for example, be a floating gate or a charge trap layer. Tunnel insulation layers 106, 206, and 306 may be provided between semiconductor layers 102, 202, and 302 and respective charge storage layers 108, 208, and 308. Source/drain impurity regions 105, 205, and 305 may be formed on respective active regions between select and word lines as shown in FIG. 3D.

An interlayer insulating layer 401 may be formed on semiconductor layers 102, 202, and 302 (e.g., including a first insulating layer between semiconductor layers 102 and 202, a second insulating layer between semiconductor layers 202 and 302, and a third insulating layer between semiconductor layer 302 and bit lines BL). Interlayer insulating layer 401 may be interposed between the semiconductor layers. Bit lines BL may extend crossing over gate lines WLi_j on interlayer insulating layer 401 on third semiconductor layer 302. Bit lines BL may extend along active regions 103, 203, and 303.

Drains of string select transistors controlled by string select lines LSSL_j may be commonly connected to a drain plug 454. Drain plug 454 may be connected to a source of main string select transistor SSTM, and a drain of the main string select transistor may be electrically connected to bit line BL through a contact plug 452. Sources of ground select transistors controlled by ground select lines LGSL_j may be commonly connected to source plug 456. Source plug 456 may be connected to a drain of main ground select transistor GSTM, and a source of main ground select transistor GSTM may be electrically connected to common source line CSL. In the drawings, common source line CSL, main string select transistor SSTM, and main ground select transistor GSTM may be formed on first semiconductor layer 102, but other configurations may be provided according to other embodiments of the present invention. For example, common source line CSL, main string select transistor SSTM, and/or main ground select transistor GSTM may be formed on second semiconductor layer 202 and/or third semiconductor layer 302. Drain plug 452 and source plug 454 may be formed of a barrier metal layer and a conductive metal layer on the barrier metal layer. The barrier metal layer may be formed of at least one of a titanium layer, a tantalum layer, a tungsten layer, a titanium nitride layer, a tantalum nitride layer, and/or a tungsten nitride layer. The conductive metal layer may be formed of at least one of a copper layer, an aluminum layer, and/or a tungsten layer. Moreover, the barrier and conductive metal layers may comprise layers of different materials.

Referring to FIGS. 3A and 3B, a memory cell array region in a semiconductor device with a three-dimensional structure may include first cell block 100 of first semiconductor layer 102, second cell block 200 of second semiconductor layer 202, and third cell block 300 of third semiconductor layer 302. First, second, and third cell blocks 100, 200, and 300 respectively include first, second, and third gate lines. The row decoder region may include first row decoder DEC1 controlling first gate lines, second row decoder DEC2 controlling second gate lines, and third row decoder DEC3 controlling third gate lines.

Referring to FIG. 3B, first gate lines including word lines WLi_1 and string select line LSSL_1 at the first semiconductor layer may be connected to first row decoder DEC1 through first wirings. Each first wiring may include first gate line contact 412 connected to respective first gate line WLi_1, first metal pattern 414 connected to first gate line contact 412, and first decoder contact 416 connecting first metal pattern 414 with first row decoder DEC1. Second gate lines including second word lines WLi_2 and second string select line LSSL_2 at the second semiconductor layer may be connected to the second row decoder through second wirings. Each second wiring may include second gate line contact 422 connected to a respective second gate line, second metal pattern 424 connected to second gate line contact 422, and second decoder contact 426 connecting second metal pattern 424 with second row decoder DEC2. Third gate lines including word lines WLi_3 and string select line LSSL_3 at the third semiconductor layer may be connected to the third row decoder through third wirings. Each third wiring may include third gate line contact 432 connecting a respective third gate line, third metal pattern 434 connected to third gate line contact 432, and third decoder contact 436 connecting third metal pattern 434 with third row decoder DEC3. Each of gate line contacts 412, 422, and 432 may be disposed on a side of a respective gate line adjacent to the row decoder region in the cell array region. Each of contacts 412, 422, 432, 416, 426, and 436 may be formed of a barrier metal layer and a conductive metal layer on the barrier metal layer. The barrier metal layer may be formed of at least one of a titanium layer, a tantalum layer, a tungsten layer, a titanium nitride layer, a tantalum nitride layer, and/or a tungsten nitride layer. The conductive metal layer may be formed of at least one of a copper layer, an aluminum layer, and/or a tungsten layer. Moreover, the barrier and conductive metal layers may comprise layers of different materials.

For a convenience of wiring, line contacts 414, 424, and 434 may be stacked on insulating layer 401. More particularly, line contacts 414 and 424 may be separated by an insulating layer and line contacts 424 and 434 may be separated by another insulating layer. Bit lines BL may be simultaneously formed using a same metal layer used to form line contacts 414, line contacts 424, or line contacts 434. Accordingly, bit lines BL may be formed of a same material used for first, second, or third line contacts 414, 424, or 434.

Referring to FIG. 3C, ground select transistors GSTLj may be commonly controlled using one select signal GSL, and ground select lines LGSL-j may thus be commonly connected to first, second, and third row decoders through a ground line. The ground line may include ground line contact 442 (connected to first ground select line LGSL_1, second ground select line LGSL_2, and third ground select line LGSL_3), ground metal pattern 444 connected to ground line contact 442, and ground decoder contacts 446, 447, and 448. Ground line contact 442 may pass through the first and second ground select lines to contact the third ground select line. Ground metal pattern 444 may be substantially formed of a same material of bit lines BL. Accordingly, ground metal pattern 444 and bit lines BL may be formed simultaneously using a same metal layer.

First row decoder DEC1 may be provided on a location closest to the cell array region and farthest from third row decoder DEC3. Second row decoder DEC2 may be provided between first row decoder DEC1 and third row decoder DEC3.

A number of first gate lines, a number of first row decoders controlling first gate lines, a number of second gate lines, a number of second row decoders controlling second gate lines, a number of the third gate lines, and a number of third row decoder outputs controlling the third gate lines may be the same.

Figure 3E:
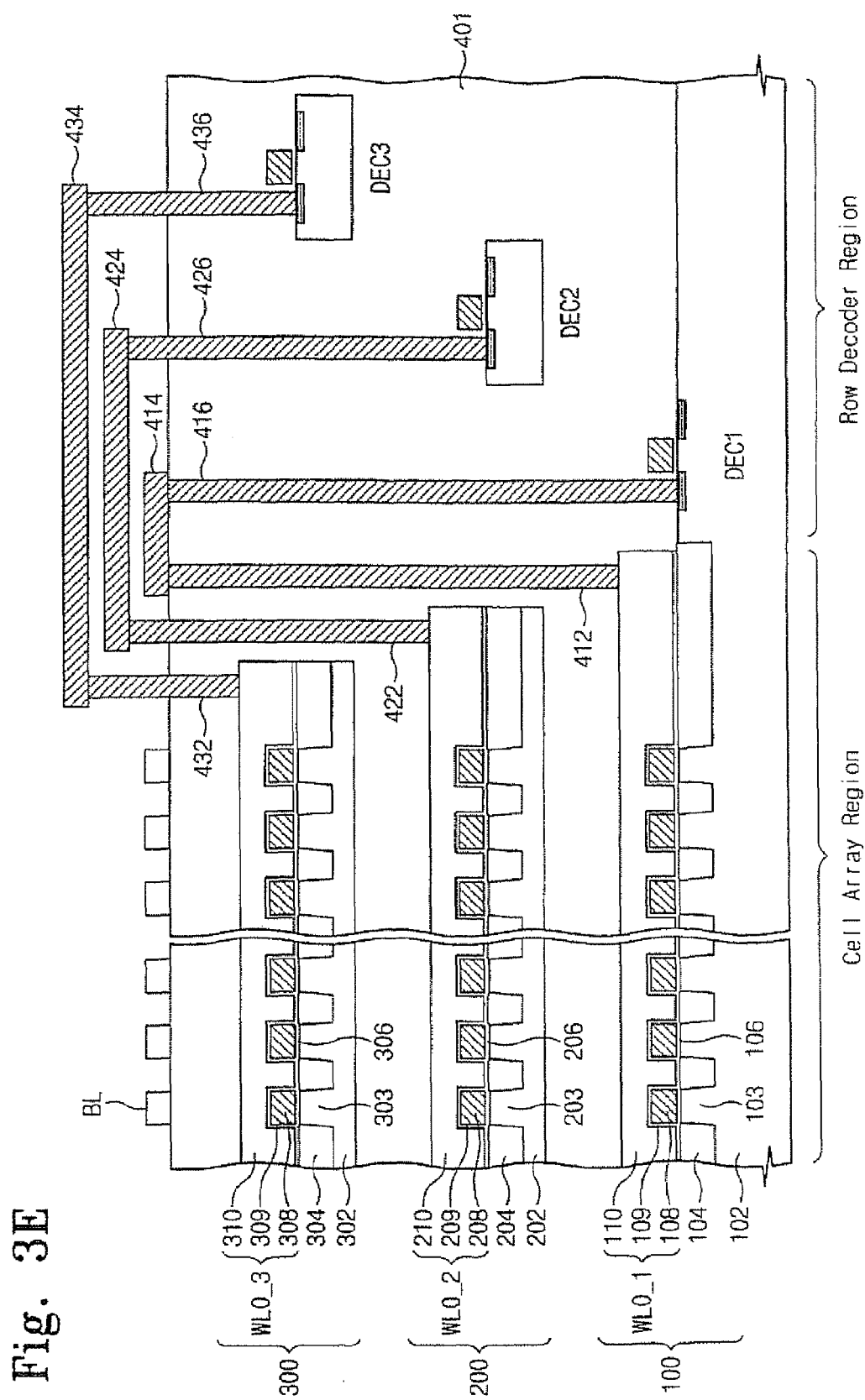
FIG. 3E is a cross-sectional view taken along section line I-I' of FIG. 3A according to other embodiments of the present invention.

Referring to FIGS. 3B, and 3C, first row decoder DEC1, second row decoder DEC2, and third row decoder DEC3 may be provided on first semiconductor layer 102, but other orientations may be provided according to other embodiments of the present invention. For example, second row decoder DEC2 may be provided on portions of second semiconductor layer 202, and third row decoder DEC3 may be provided on portions of third semiconductor layer 302 as shown, for example in FIG. 3E. Therefore, an entire area of the row decoder region may be reduced, such that the degree of integration may be increased.

In semiconductor devices with three-dimensional structures according to embodiments of the present invention, various modified methods of connecting row decoder regions with the memory cell array regions are described herein. In semiconductor devices with three-dimensional structures similar to FIG. 3A, various modified methods of connecting word lines of each semiconductor layer with the respective row decoder may be provided. FIGS. 4A, 5A, 7A, 8A, 9A, 10A, 11A, 12A, 13A, and 14A are views of various modified embodiments of semiconductor devices with three dimensional structures of FIG. 2. FIGS. 4B, 5B, 7B, 8B, 9B, 10B, 11B, 12B, 13B, and 14B are cross-sectional views taken along lines I-I' of FIGS. 4A, 5A, 7A, 8A, 9A, 10A, 11A, 12A, 13A, and 14A, respectively. For the sake of conciseness, only the word line cross sections are shown.

Figure 4A:
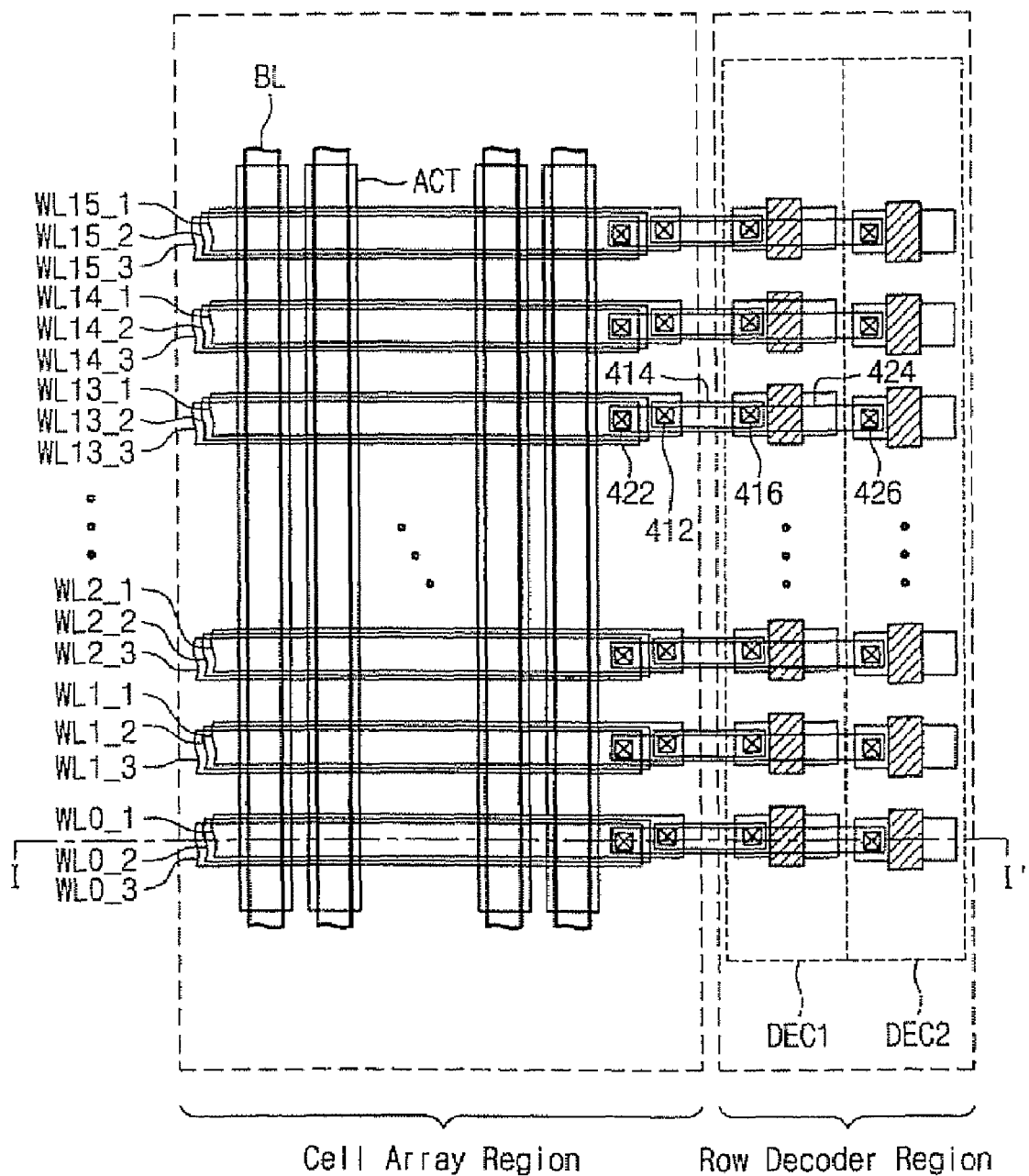
FIGS. 4A and 5A are views of various modified embodiments of the semiconductor device with a three dimensional structure of FIG. 2.
Figure 4B:
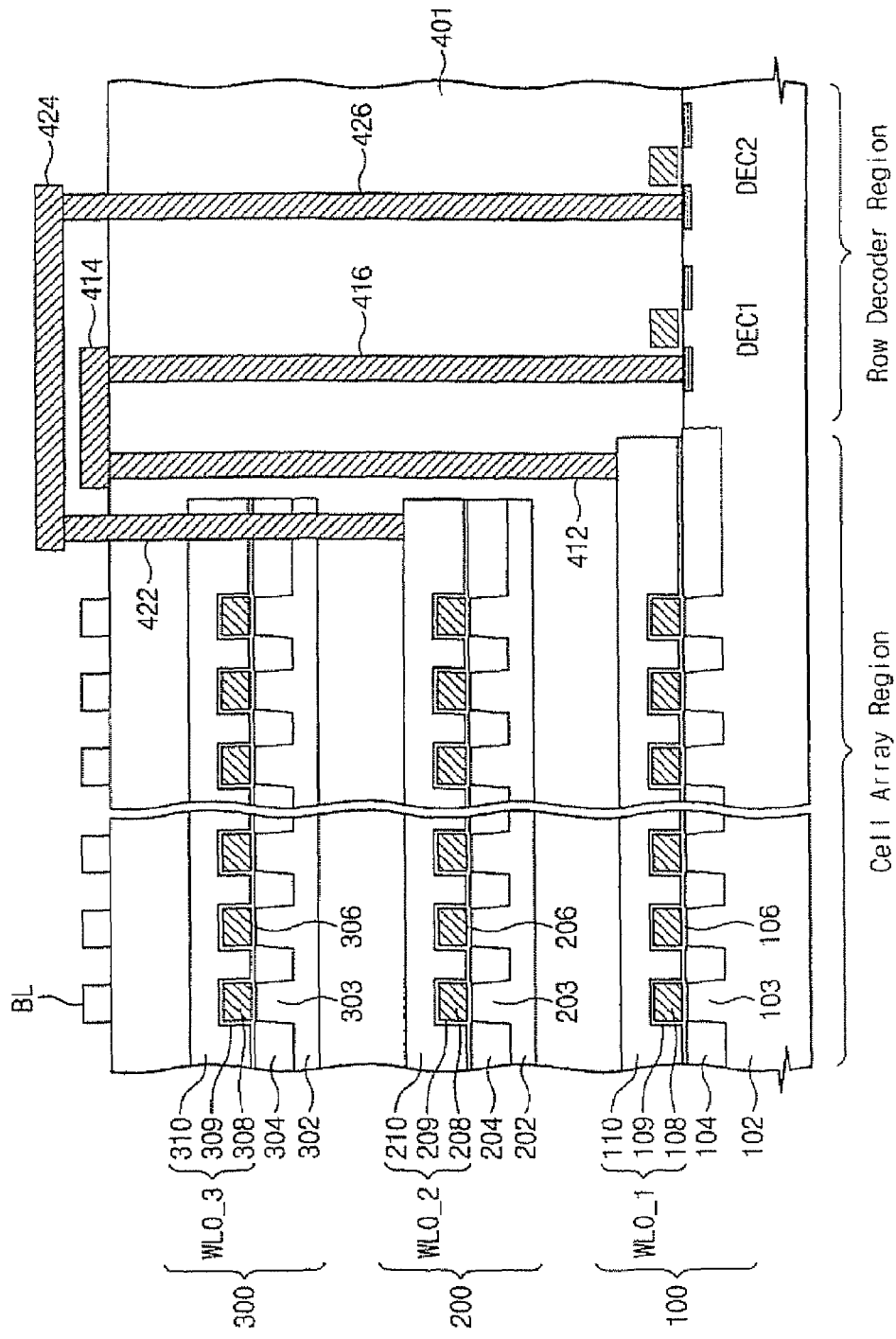
FIGS. 4B and 5B are cross-sectional views taken along lines I-I' of FIGS. 4A and 5A, respectively.

Referring to FIGS. 4A and 4B, first word line WLi_1 is connected to first row decoder DEC1 through a first wiring, and second word line WLi_2 and third word line WLi_3 are commonly connected to second row decoder DEC2 through a second wiring. The first wiring includes first word line contact 412 connected to first word line WLi_1, first metal pattern 414 connected to first word line contact 412, and first decoder contact 416 connecting first metal pattern 414 with first row decoder DEC1. The second wiring includes second word line contact 422 connected to first word line WLi_2 and third word line WLi_3, second metal pattern 424 connected to second word line contact 422, and second decoder contact 426 connecting second metal pattern 424 with second row decoder DEC2. Second word line contact 422 passes through third word line WLi_3 to contact second word line WLi_2. Second row decoder DEC2 may commonly control second and third word lines WLi_2 and WLi_3. First word line contact 412 and second word line contact 422 may be disposed on sides of respective word lines adjacent to the row decoder region in the cell array region. For a convenience of wiring, first and second metal patterns 414 and 424 may be stacked on insulating layer 401. In addition, metal patterns 414 and 424 may be separated by an insulating layer.

Figure 5A:
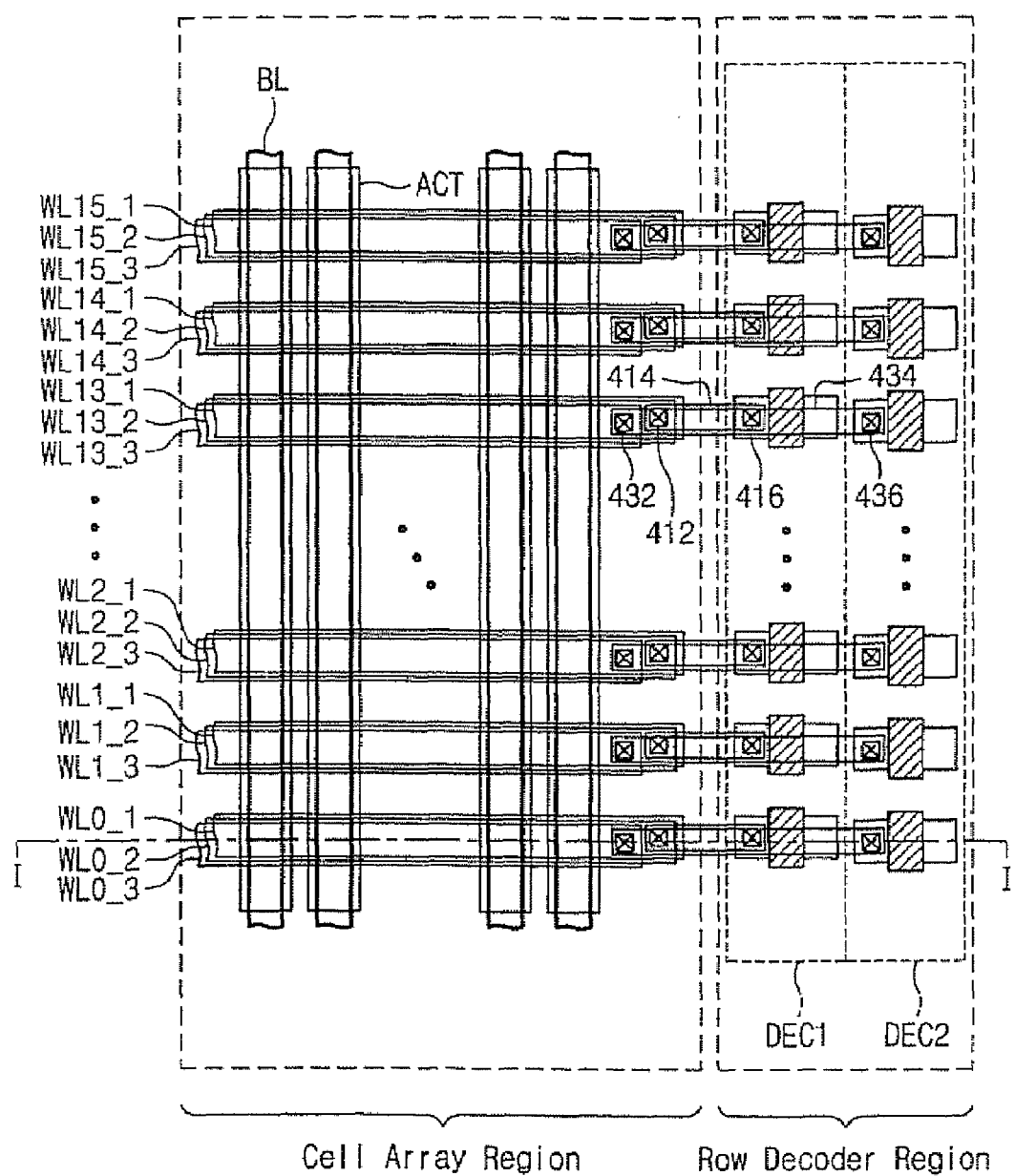
Figure 5B:
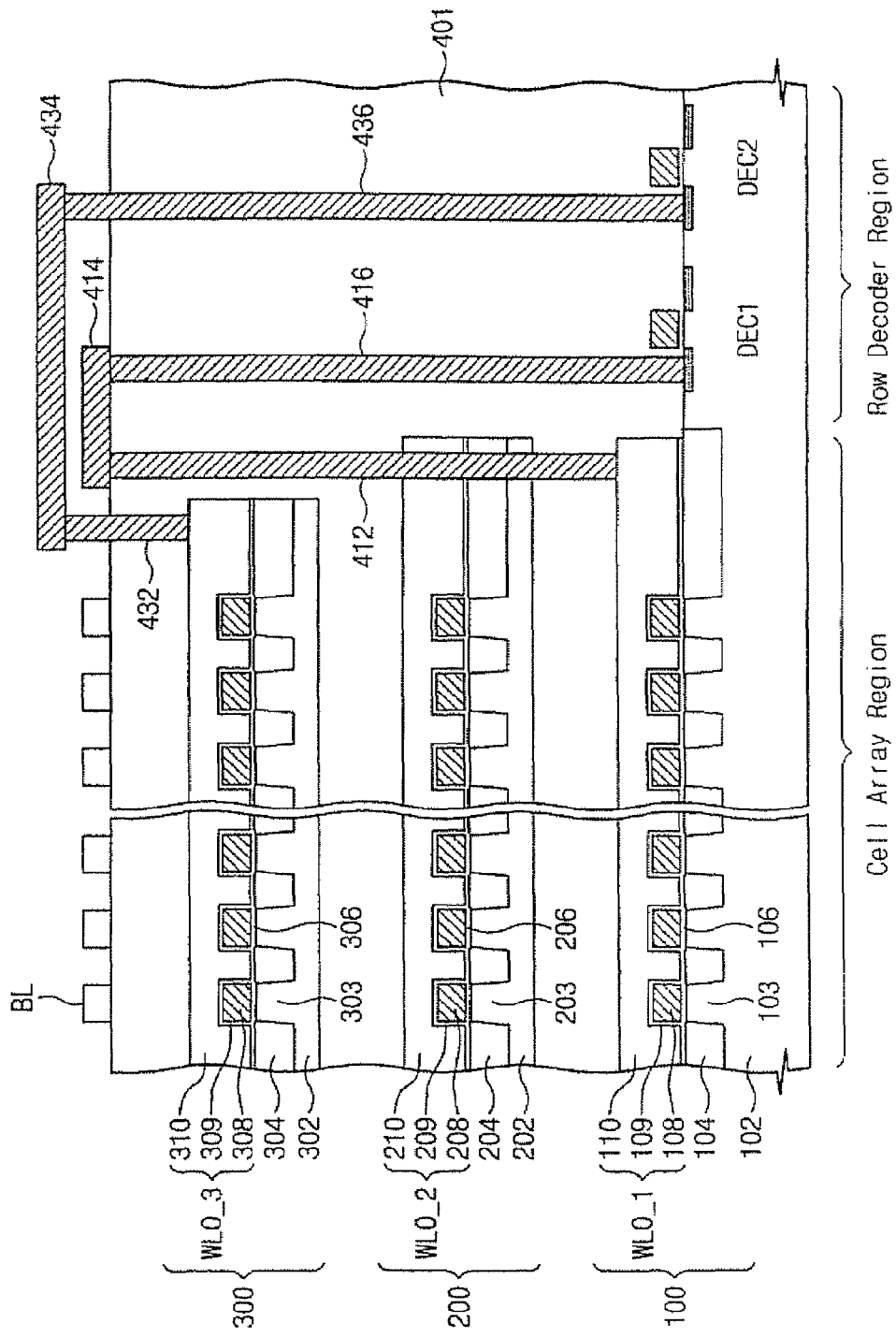

Referring to FIGS. 5A and 5B, first and second word lines WLi_1 and WL2_2 may be connected to first row decoder DEC1 through the first wiring, and third word line WLi_3 may be connected to second row decoder DEC2 through the second wiring. The first wiring may include first word line contact 412 connected to first word line WLi_1 and second word line WLi_2, first metal pattern 414 connected to first word line contact 412, and first decoder contact 416 connecting first metal pattern with first row decoder DEC1. First word line contact 412 may pass through second word line WLi_2 to contact first word line WLi_1. The second wiring includes third word line contact 432 connected to third word line WLi_3, third metal pattern 434 connected to third word line contact 432, and third decoder contact 436 connecting third metal pattern 434 with second row decoder DEC2. First row decoder DEC1 may commonly control first and second word lines WLi_1 and WLi_2. First word line contact 412 and third word line contact 432 may be disposed on sides of respective word lines adjacent to the row decoder region in the cell array region. For a convenience of wiring, first and third metal patterns 414 and 434 may be stacked on insulating layer 401. In addition, metal patterns 414 and 434 may be separated by an insulating layer.

Figure 6:
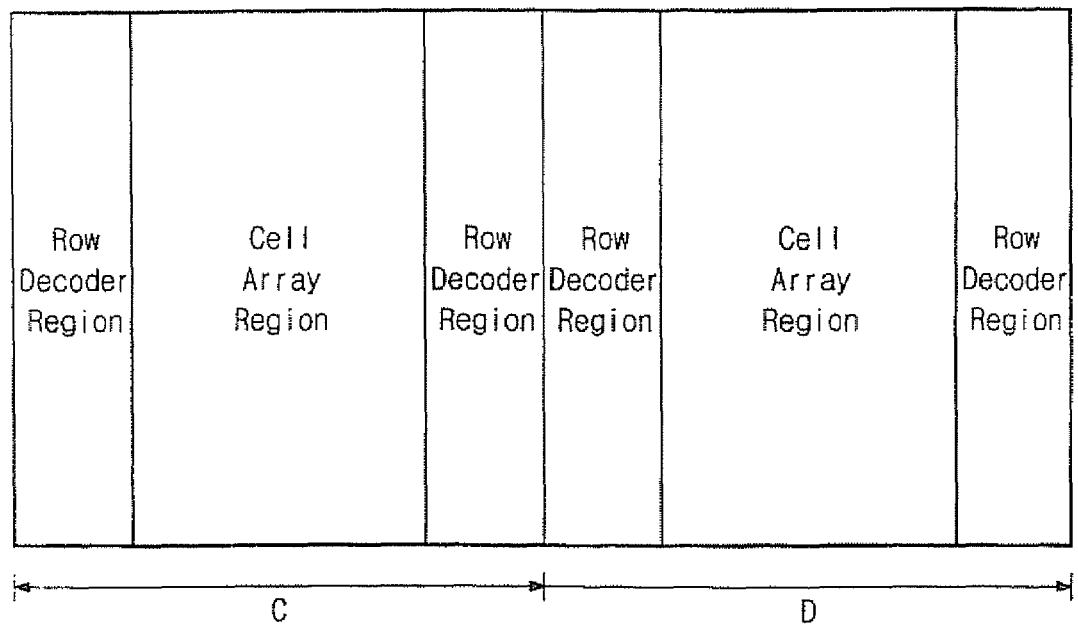
FIG. 6 is a view of a row decoder arrangement in a semiconductor device with a three dimensional structure according to other embodiments of the present invention.

Referring to FIG. 6, the memory cell array region may include respectively separated cell array regions and row decoder regions between the cell array regions. The row decoder regions are provided on both sides of the memory cell array regions. At least one row decoder in each row decoder region on opposite sides of a cell array region may be provided adjacent another row decoder. Hereinafter, layouts of a semiconductor device with a three-dimensional structure of FIG. 1, which is arranged using the method of FIG. 6, and their cross-sectional views are described. Only region C of FIG. 6 will be illustrated for sake of conciseness.

Figure 7A:
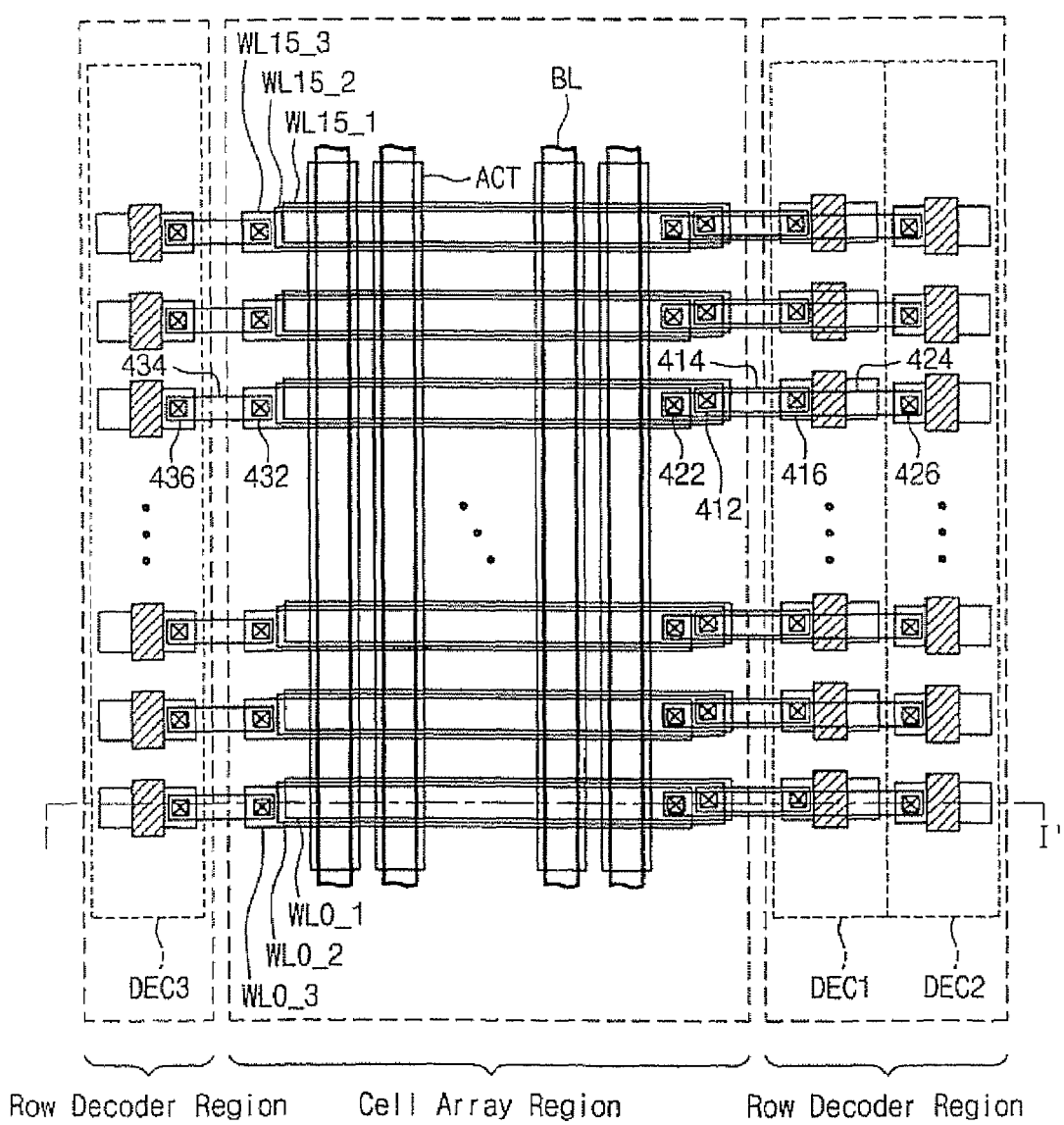
FIGS. 7A, 8A, 9A, 10A, 11A, 12A, 13A and 14A are views of various modified embodiments of semiconductor devices with three dimensional structures of FIG. 6 according to embodiments of the present invention.
Figure 7B:
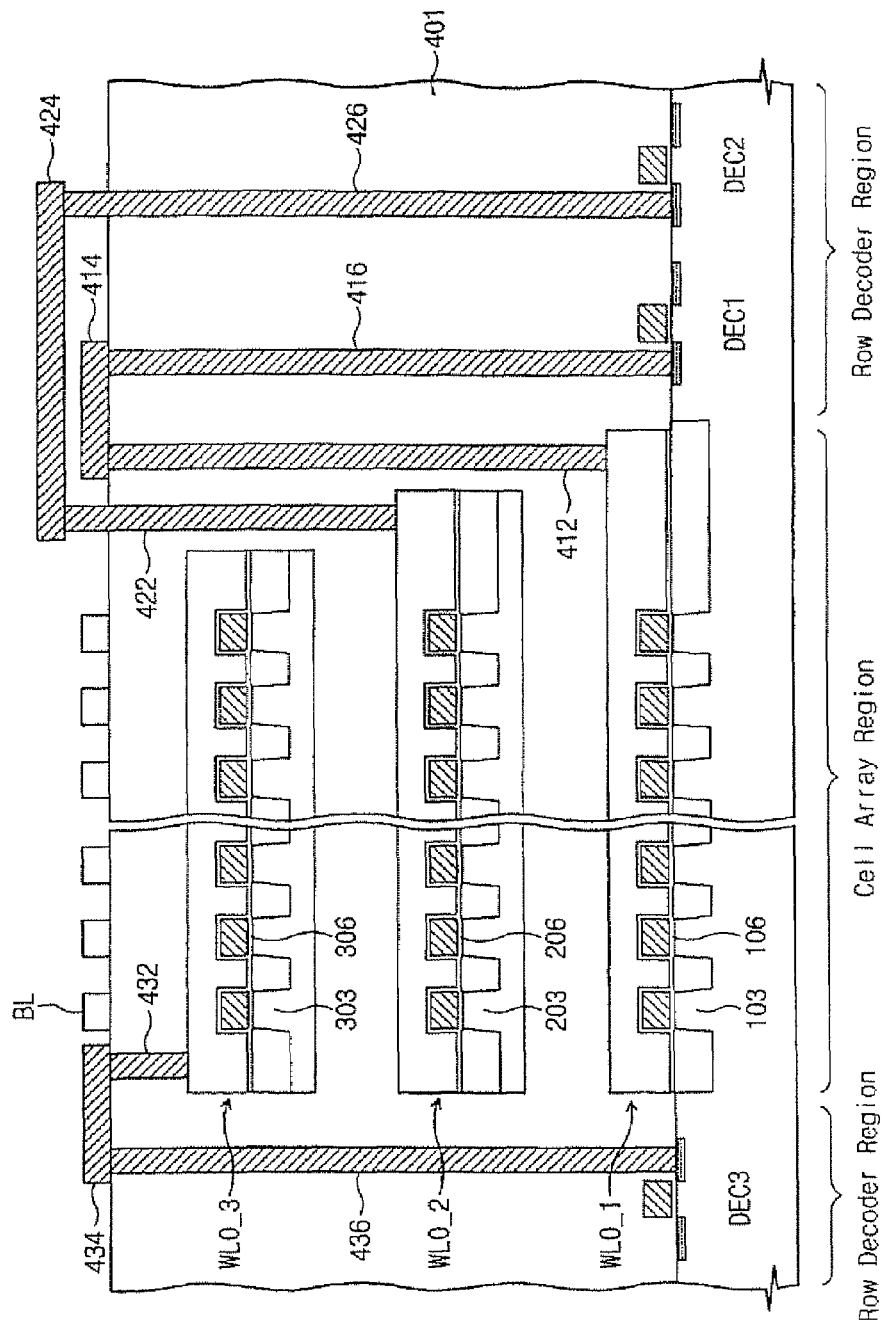
FIGS. 7B, 8B, 9B, 10B, 11B, 12B, 13B, and 14B are cross-sectional views taken along lines I-I' of FIGS. 7A, 8A, 9A 10A, 11A, 12A, 13A, and 14A, respectively.

Referring to FIGS. 7A and 7B, third row decoder DEC3 is provided on a first side of the cell array region and first and second row decoders DEC1 and DEC2 are provided on a second side of the cell array region. First word line WLi_1 may be connected to first row decoder DEC1 through first wiring, second word line WLi_2 may be connected to second row decoder DEC2 through second wiring, and third word line WLi_3 may be connected to third row decoder DEC3 through third wiring. First wiring may include first word line contact 412 connected to first gate line WLi_1, first metal pattern 414 connected to first word line contact 412, and first decoder contact 416 connecting first metal pattern 414 with first row decoder DEC1. Second wiring may include second word line contact 422 connected to second word line WLi_2, second metal pattern 424 connected to second word line contact 422, and second decoder contact 426 connecting second metal pattern 424 with second row decoder DEC2. The third wiring may include a third word line contact 432 connected to third word line WLi_3, third metal pattern 434 connected to third word line contact 432, and third decoder contact 436 connecting third metal pattern 434 with third row decoder DEC3. First word line contact 412 and second word line contact 422 may be provided on sides of respective word lines adjacent to first and second row decoder regions at the cell array regions. Third word line contact 432 may be provided on sides of word lines adjacent to third row decoder region at the cell array region. For a convenience of wiring, first metal pattern 414 and second metal pattern 424 may be sequentially stacked on insulating layer 401. Third metal pattern 434 of third wiring may be provided on insulating layer 401 like first metal pattern 414 and/or second metal pattern 424.

Figure 8A:
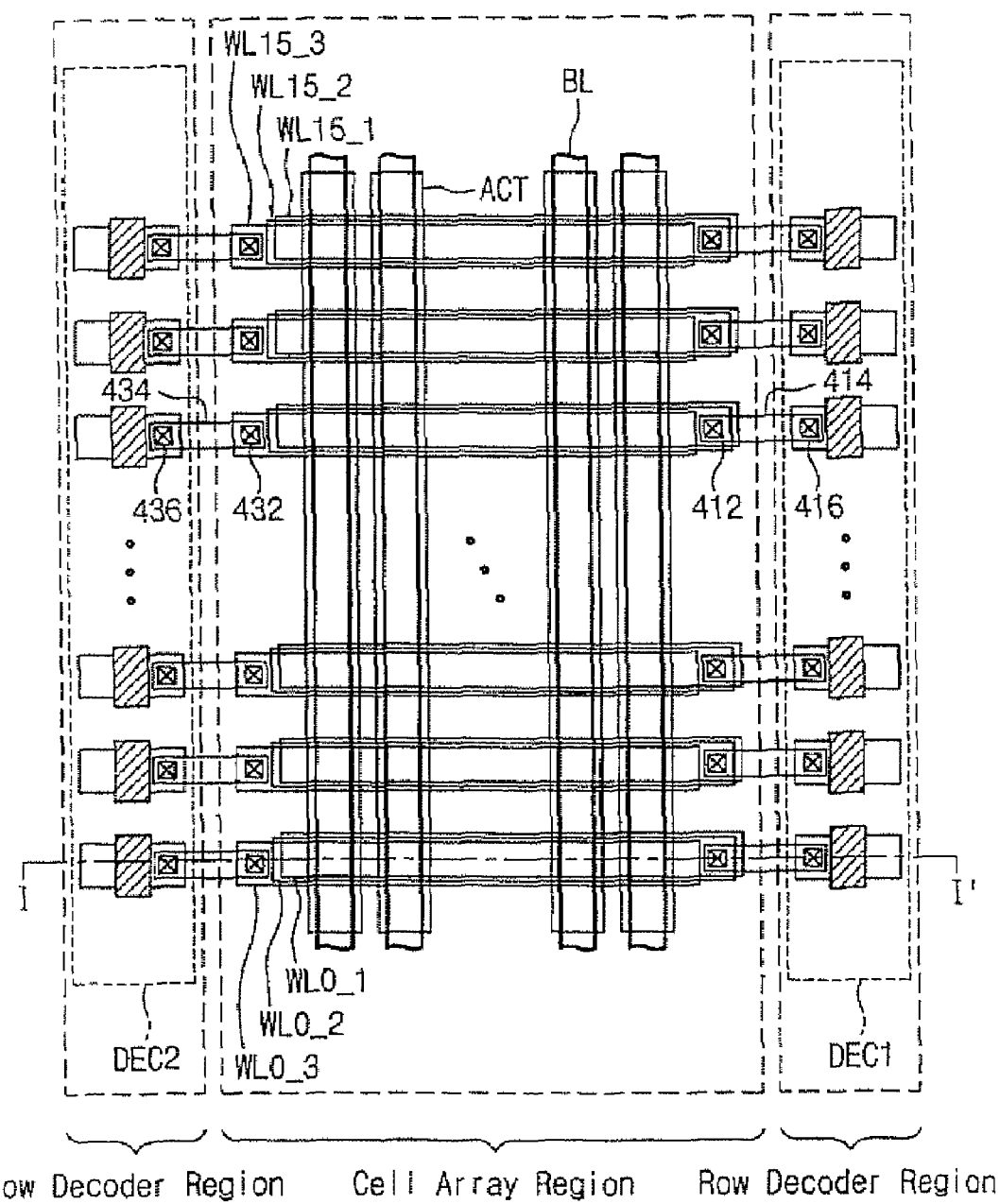
Figure 8B:
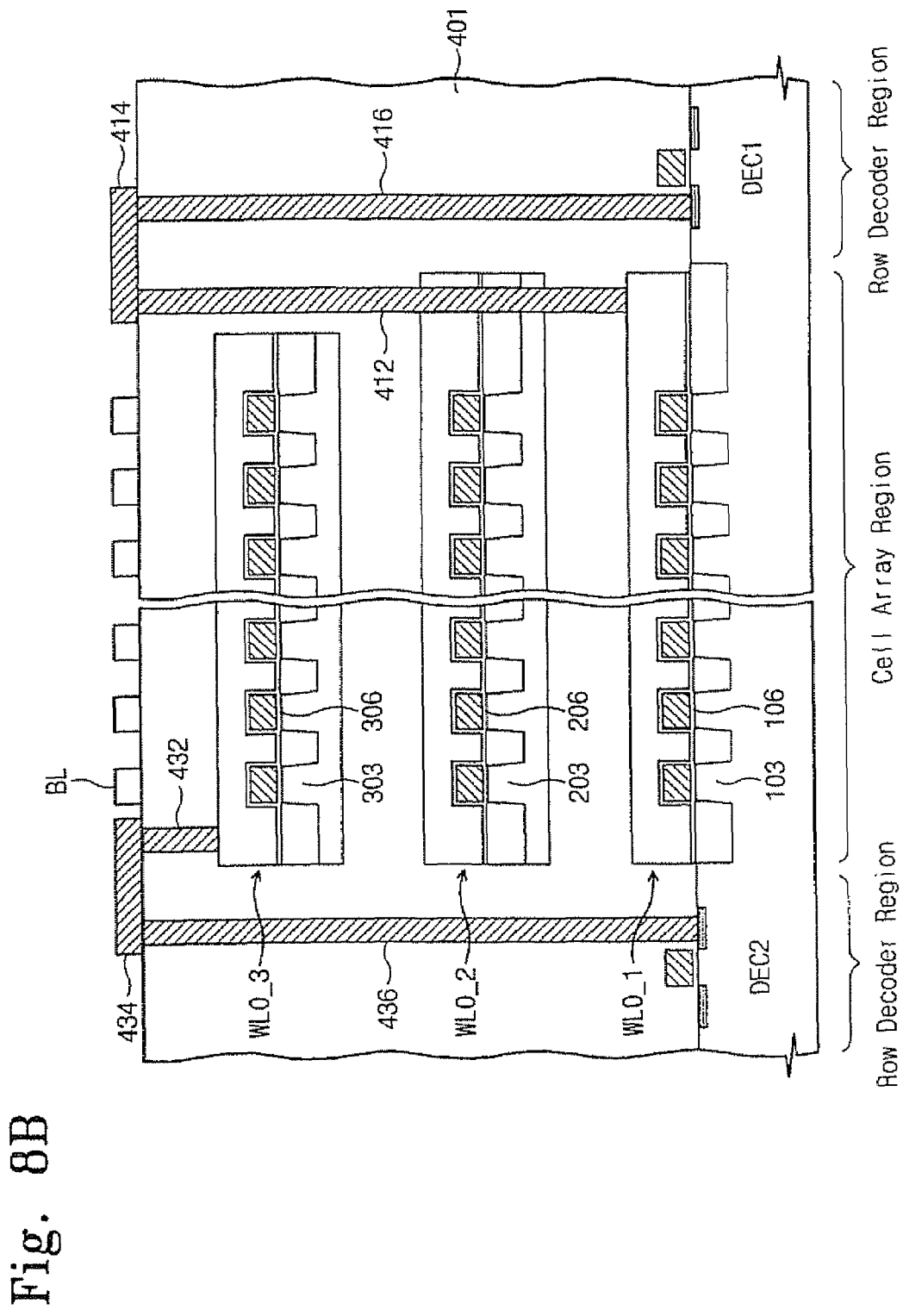

Referring to FIGS. 8A and 8B, first row decoder DEC1 and second row decoder DEC2 may be provided on opposite sides of the memory cell array region. First row decoder DEC1 may commonly control first and second word lines WLi_1 and WLi_2, and second row decoder DEC2 may control third word line WLi_3.

First and second word lines WLi_1 and WLi_2 may be commonly connected to first row decoder DEC1 through first wiring, and third word line WLi_3 may be connected to second row decoder DEC 2 through second wiring. First wiring may include first word line contact 412 connecting first and second word lines WLi_1 and WLi_2, first metal pattern 414 connected to first word line contact 412, and first decoder contact 416 connecting first metal pattern with first row decoder DEC_1. First word line contact 412 may pass through second word line WLi_2 to contact first word line WLi_1. Second wiring may include third word line contact 432 connected to third word line WLi_3, third metal pattern 434 connected to third word line contact 432, and third decoder contact 436 connected to third metal pattern 434 with second row decoder DEC2. First row decoder DEC1 may commonly control first and second word lines WLi_1 and WLi_2. First word line contact 412 may be provided on a side of word lines adjacent to first row decoder region at the cell array region. Third word line contact 432 may be provided on a side of word lines adjacent to second row decoder region at the cell array region. For a convenience of wiring, first metal pattern 414 and third metal pattern 434 may have a same height on insulating layer 401.

Figure 9A:
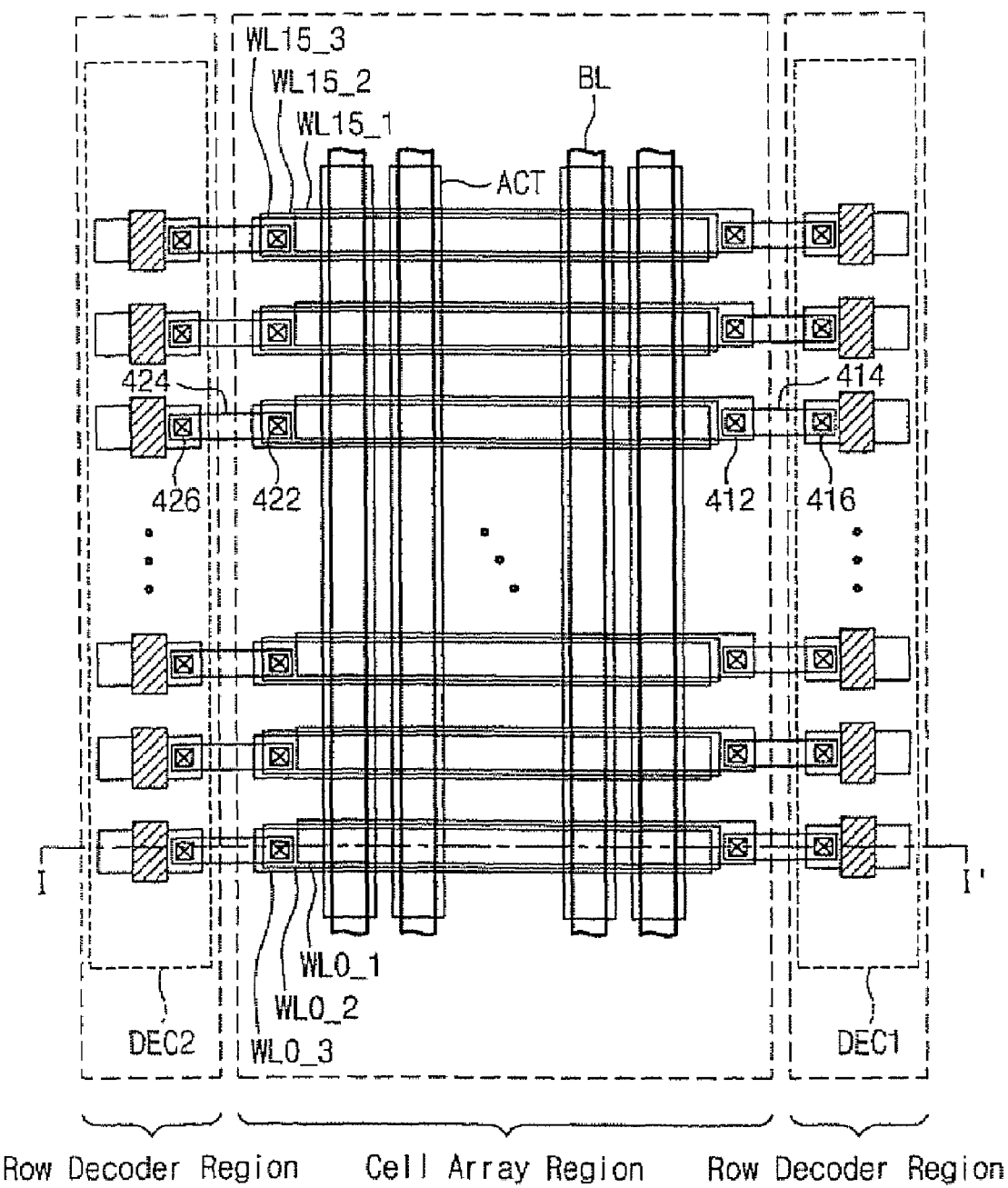
Figure 9B:
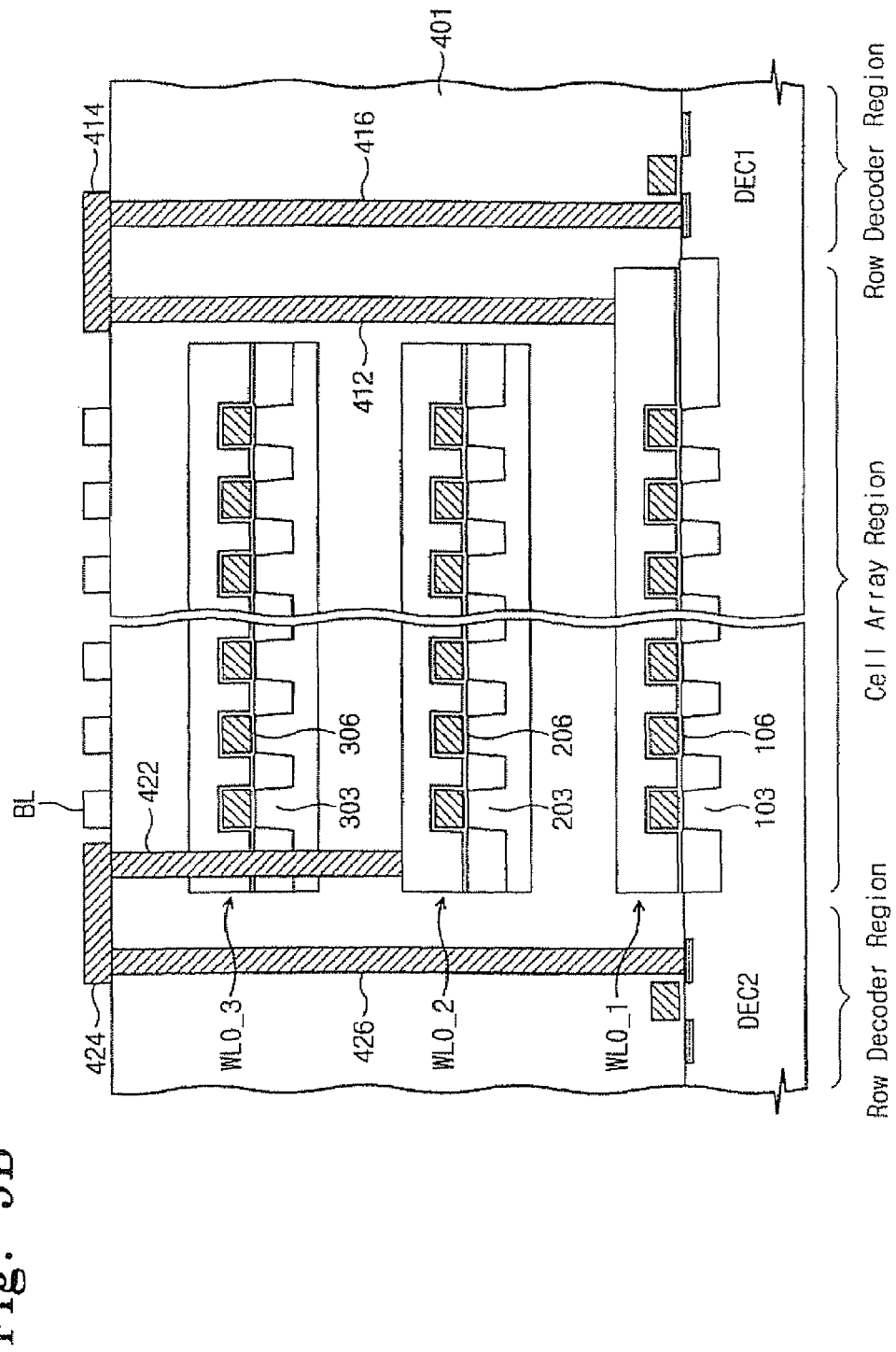

Referring to FIGS. 9A and 9B, first row decoder DEC1 and second row decoder DEC2 may be provided on opposite sides of the memory cell array region. First row decoder DEC1 may control first word line WLi_1. Second row decoder DEC2 may control second and third word lines WLi_2 and WLi_3.

First word line WLi_1 may be connected to first row decoder DEC1 through first wiring, and second and third word lines WLi_2 and WLi_3 may be connected to second row decoder DEC2 through second wiring. First wiring includes first word line contact 412 connected to first word line WLi_1, first metal pattern 414 connected to first word line contact 412, and first decoder contact 416 connecting first metal pattern 414 with first row decoder DEC 1. Second wiring may include second word line contact 422 connecting second and third word lines WLi_2 and WLi_3, second metal pattern 424 connected to second word line contact 422, and second decoder contact 426 connecting second metal pattern 424 with second row decoder DEC2. Second word line contact 422 may pass through third word line WLi_3 to contact second word line WLi_2. Second row decoder DEC2 may commonly control second and third word lines WLi_2 and WLi_3. First word line contact 412 may be provided on sides of word lines adjacent to first row decoder region at the cell array region. Second word line contact 422 may be provided on sides of word lines adjacent to second row decoder region at the cell array region. For a convenience of wiring, first metal pattern 414 and second metal pattern 424 may be provided on a same plane on insulating layer 401.

Hereinafter, embodiments of memory structures including two semiconductor layers will be described by way of example to describe modified methods of connecting word lines of each semiconductor layer with a row decoder.

For a convenience of description, first row decoder DEC1 may include first odd row decoder DEC1_odd controlling first odd word line WLodd_1, and first even row decoder DEC1_even controlling first even word line WLeven_1. Second row decoder DEC2 may include second odd row decoder DEC2_odd controlling second odd word line WLodd_2, and second even row decoder DEC2_even controlling second even word line WLeven_2. When WLi_1 is in first odd word line WLodd_1, i=0, 2, 4, ..., 14. When WLi_1 is in first even word line WLeven_1, i=1, 3, 5, ..., 15. First odd row decoder DEC1_odd and first even row decoder DEC1_even may be provided on opposite sides of the cell array region, and second odd row decoder DEC2_add and second even row decoder DEC2_even may be provided on opposite sides of the cell array region.

Figure 10A:
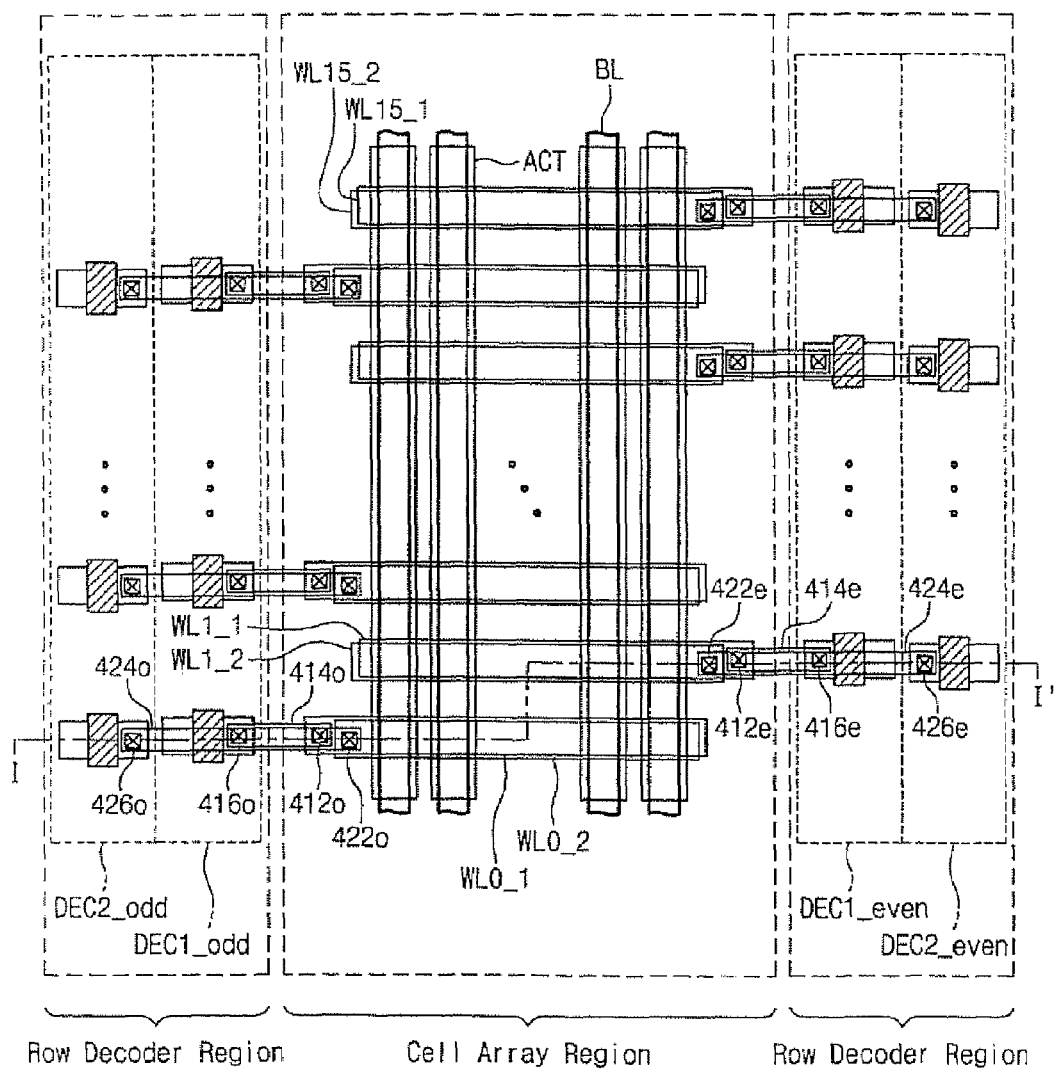
Figure 10B:
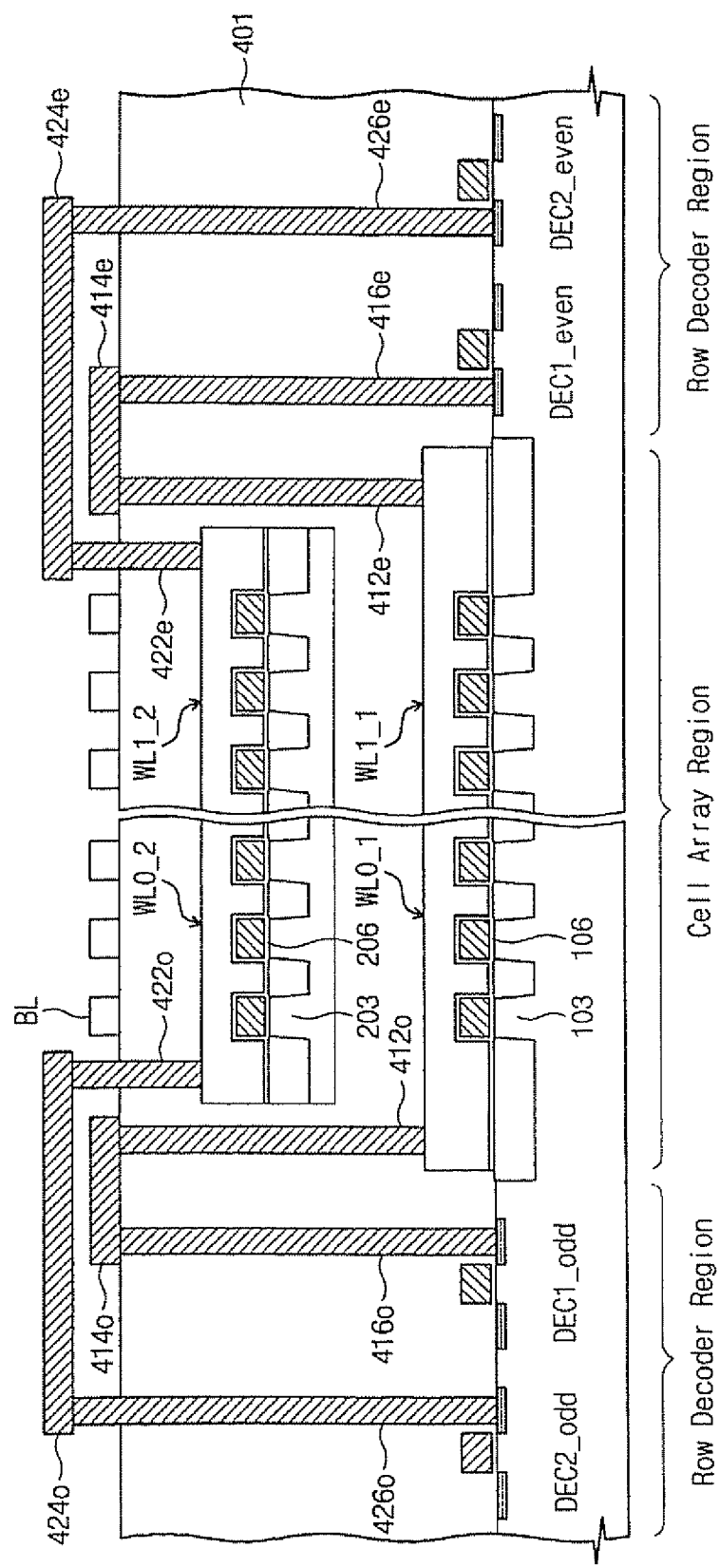

Referring to FIGS. 10A and 10B, first even row decoder DEC1_even and second even row decoder DEC2_even may be provided on one side of the cell array region, and first odd row decoder DEC1_odd and second odd row decoder DEC2_odd may be provided on the other side.

First even word line WLeven_1 may be connected to first even row decoder DEC1_even through first even wiring, and second even word line WLeven_2 may be connected to second even row decoder DEC2_even through second even wiring. First odd word line WLodd_1 may be connected to first odd row decoder DEC1_odd through first odd wiring, and second odd word line WLodd_2 may be connected to second odd row decoder DEC2_odd through second odd wiring.

First even wiring may include first even word line contact 412e connected to first even word line WLeven_1, first even metal pattern 414e connected to first even word line contact 412e, and first even decoder contact 416e connecting first even metal pattern 414e with first even row decoder DEC1_even. Second even wiring may include second even word line contact 422e connected to second even word line WLeven_9, second even metal pattern 424e connected to second even word line contact 422e, and second even decoder contact 426e connecting second even metal pattern 424e with second even row decoder DEC2_even. First odd wiring may include first odd word line contact 412o connected to first odd word line WLodd_1, first odd metal pattern 414o connected to first odd word line contact 412o, and first odd decoder contact 416o connecting first odd metal pattern 414o with first odd row decoder DEC1_odd. Second odd wiring may include second odd word line contact 422o connected to second odd word line WLodd_2, second odd metal pattern 424o connected to second odd word line contact 422o, and second odd decoder contact 426o connecting odd second metal pattern 424o with second odd row decoder DEC2_odd. First even word line contact 412e and second even word line contact 422e may be provided on one side of the cell array region. First odd word line contact 412o and second odd word line contact 422o may be on the other side of the cell array region.

Figure 11A:
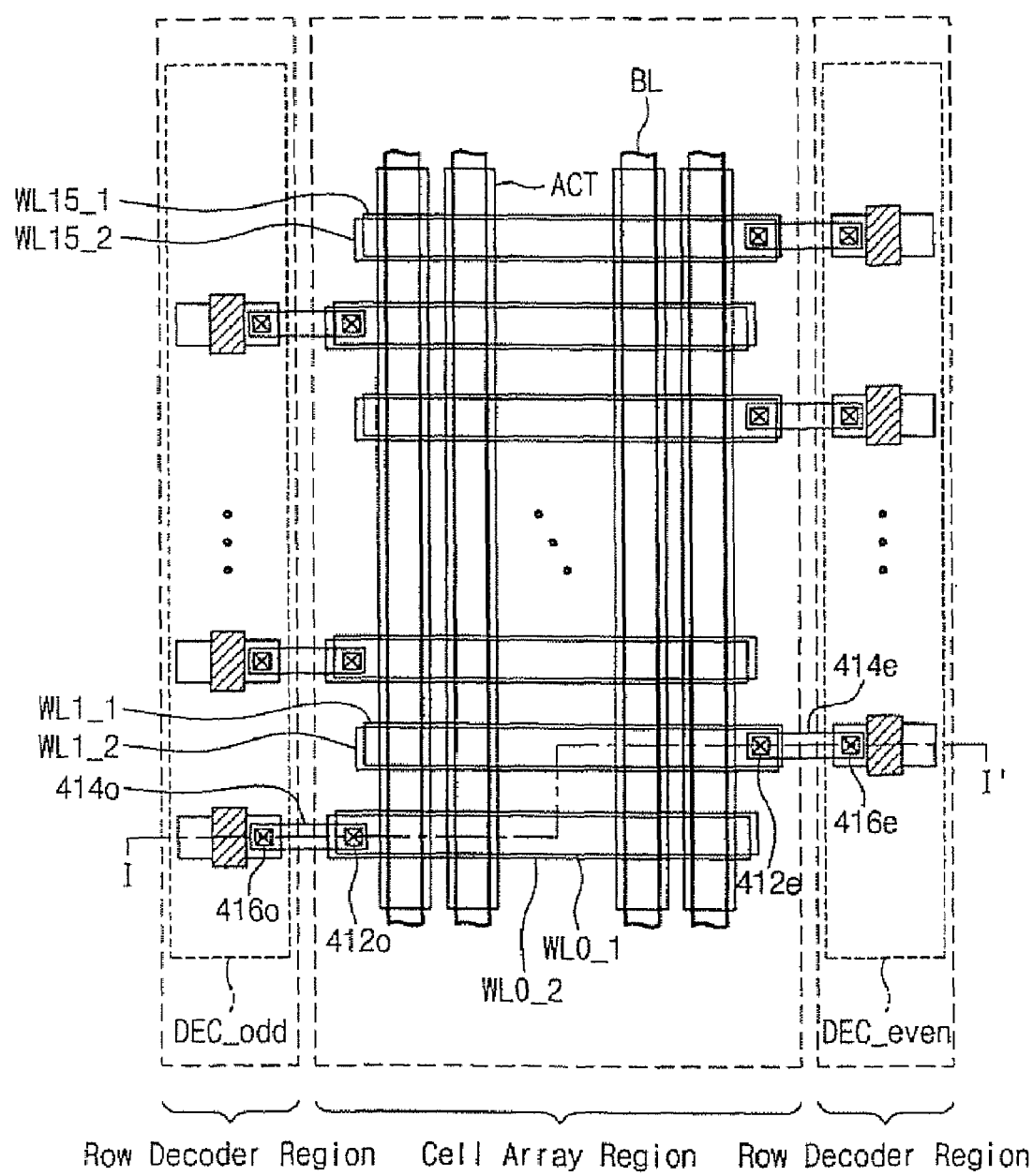
Figure 11B:
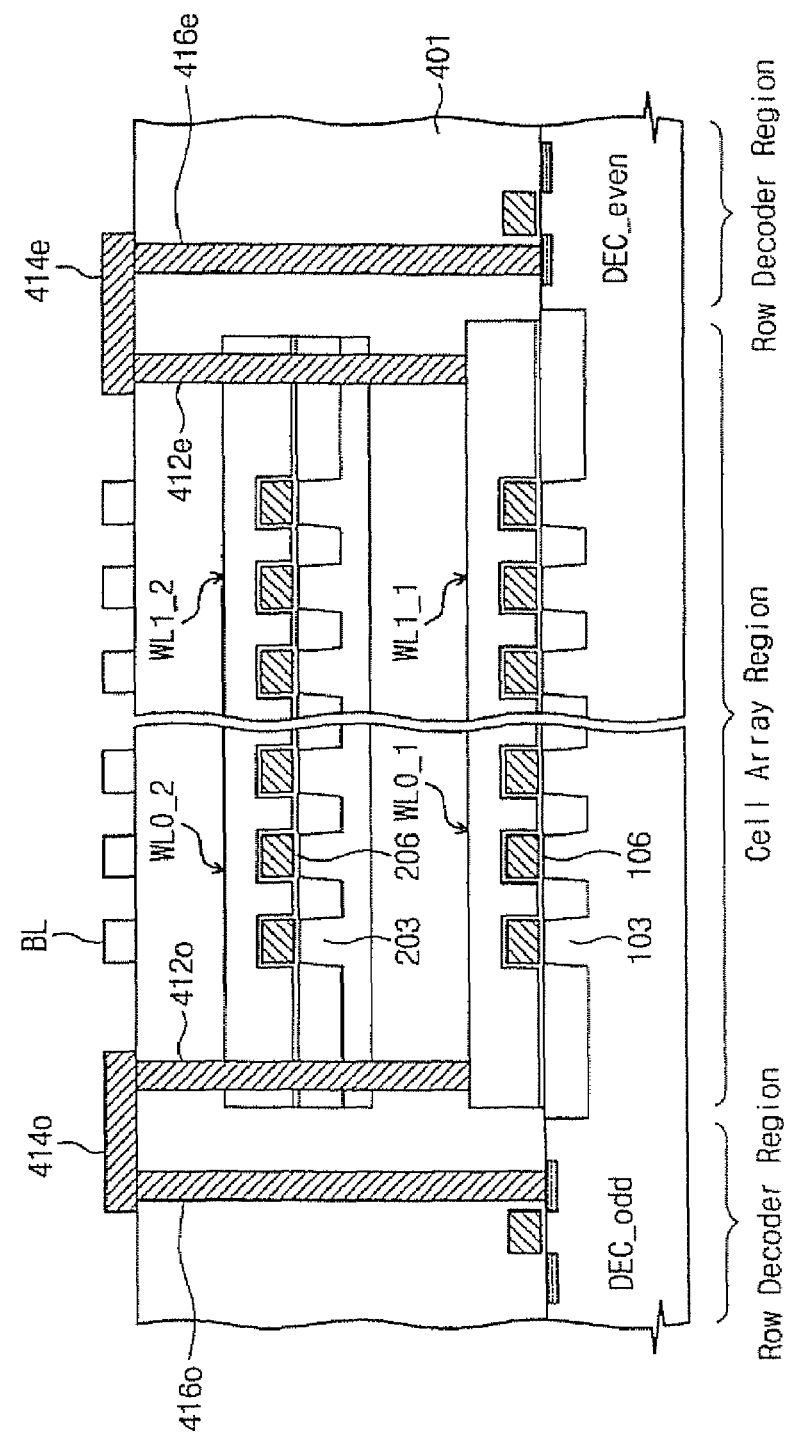

Referring to FIGS. 11A and 11B, first even row decoder and second even row decoder may be provided on one side of cell array region, and first odd row decoder and second odd row decoder may be provided on the other side of the cell array as in FIGS. 10A and 10B. A same row decoder may control corresponding word lines on both semiconductor layers.

First even word line WLeven_1 and second even word line WLeven_2 may be commonly connected to even row decoder DEC_even through even wiring. First odd word line WLodd_1 and second odd word line WLodd_2 may be commonly connected to odd row decoder DEC_odd through odd wiring.

Even wiring may include even word line contact 412e connecting first even word line WLeven_1 and second even word line WLeven_2 even metal pattern 414e connected to even word line contact 412e, and an even decoder contact 416e connecting even metal pattern 414e with even row decoder DEC_even. Odd wiring may include odd word line contact 412o connecting first odd word line WLodd_1 and second odd word line WLodd_2 odd metal pattern 414o connected to odd word line contact 412o, and odd decoder contact 416o connecting odd metal pattern 414o with odd row decoder DEC_odd. Even word line contact 412e may be provided on one side of the cell array region. Odd word line contact 412o may be provided on the other side of the cell array region.

Figure 12A:
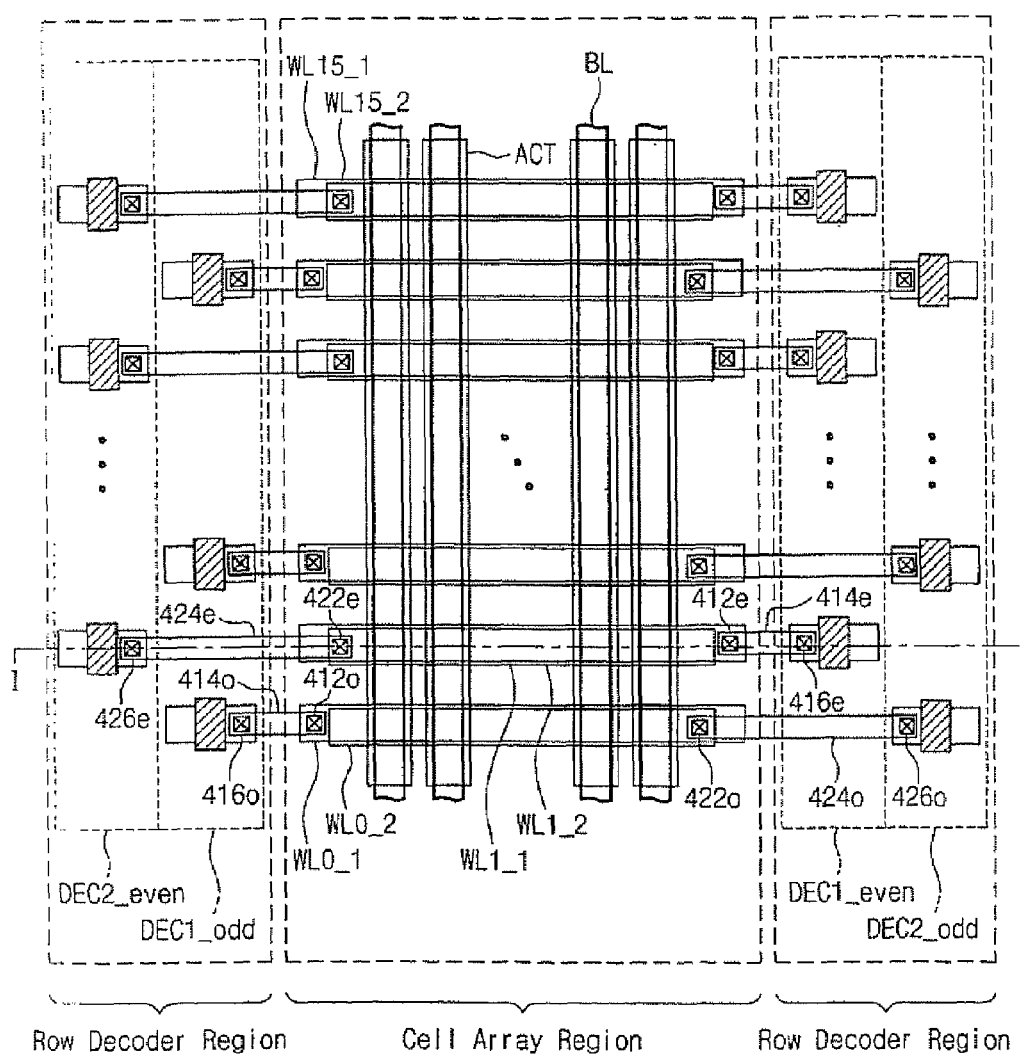
Figure 12B:
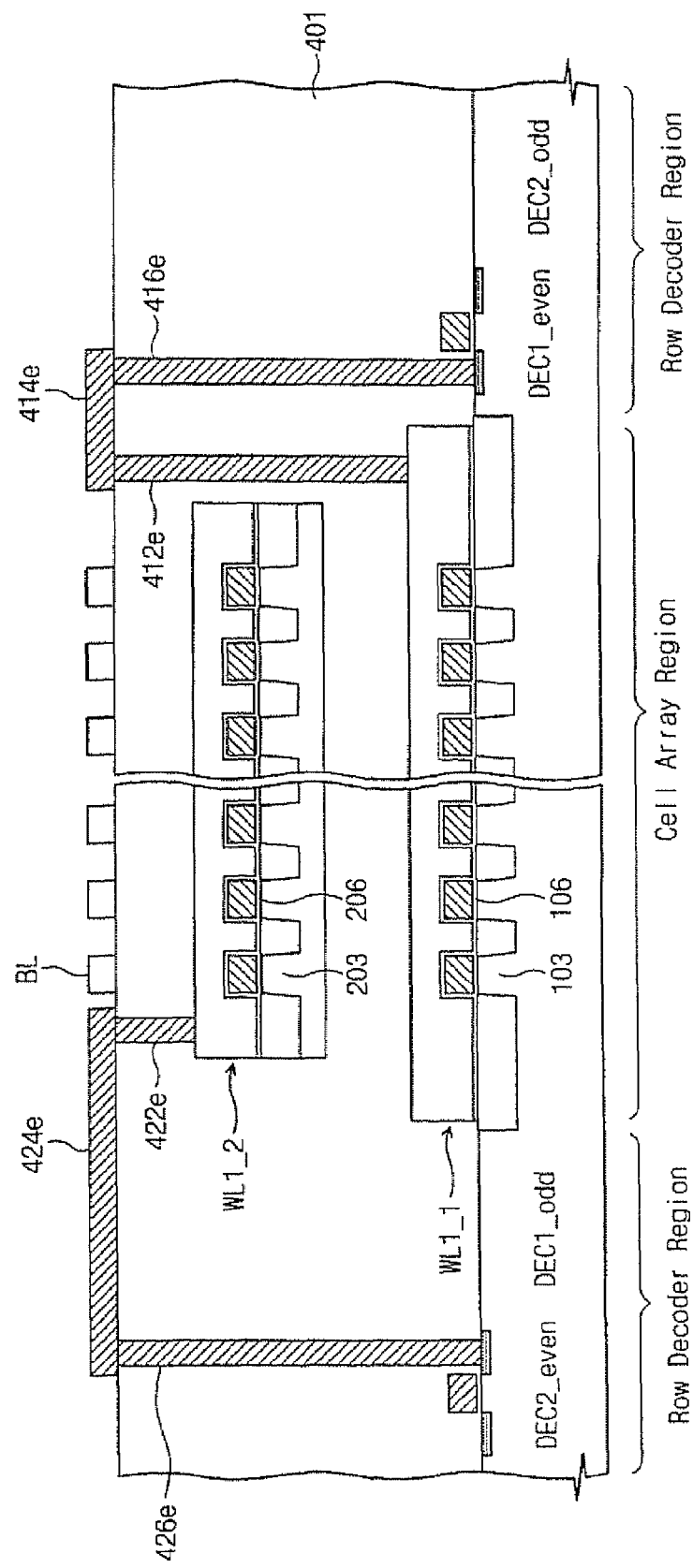

Referring to FIGS. 12A and 12B, first even row decoder and second odd row decoder may be provided on one side of the cell array region, and first odd row decoder and second even row decoder may be provided on the other side of the cell array region.

First even word line WLeven_1 may be connected to first even row decoder DEC1_even through first even wiring, and second even word line WLeven_2 may be connected to second even row decoder DEC2_even through second even wiring. First odd word line WLodd_1 may be connected to first odd row decoder DEC1_odd through first odd wiring, and second odd word line WLodd_2 may be connected to second odd row decoder DEC2_odd through second odd wiring.

First even wiring may include first even word line contact 412e connected to first even word line WLeven_1 first even metal pattern 414e connected to first even word line contact 412e, and first even decoder contact 416e connecting first even metal pattern 414e with first even row decoder DEC1_even. Second even wiring may include second even word line contact 422e connected to second even word line WLeven_2, second even metal pattern 424e connected to second even word line contact 422e, and second even decoder contact 426e connecting second even metal pattern 424e with second even row decoder DEC2_even. First odd wiring may include first odd word line contact 412*o* connected to first odd word line WLodd_1, first odd metal pattern 414*o* connected to first odd word line contact 412*o*, and first odd decoder contact 416*o* connecting first odd metal pattern 414*o* with first odd row decoder DEC1_odd. Second odd wiring may include second odd word line contact 422*o* connected to second odd word line WLodd_2, second odd metal pattern 424*o* connected to second odd word line contact 422*o*, and second odd decoder contact 426*o* connecting second odd metal pattern 424*o* with second odd row decoder DEC2_odd. First even word line contact 412*e* and second odd word line contact 422*o* may be disposed on one side of the cell array region. First odd word line contact 412*o* and second even word line contact 422*e* may be disposed on the opposite side of the cell array region.

Figure 13A:
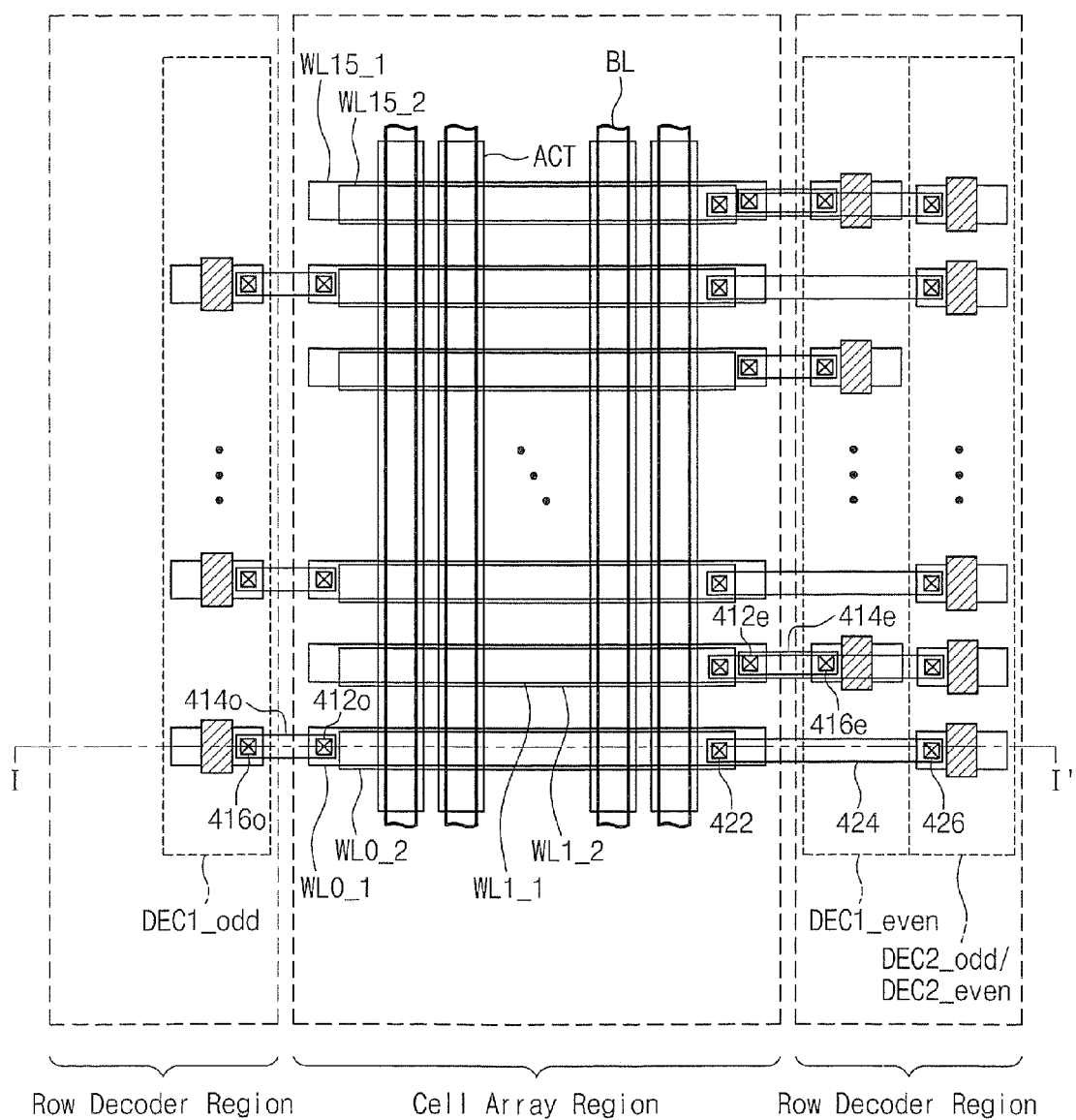
Figure 13B:
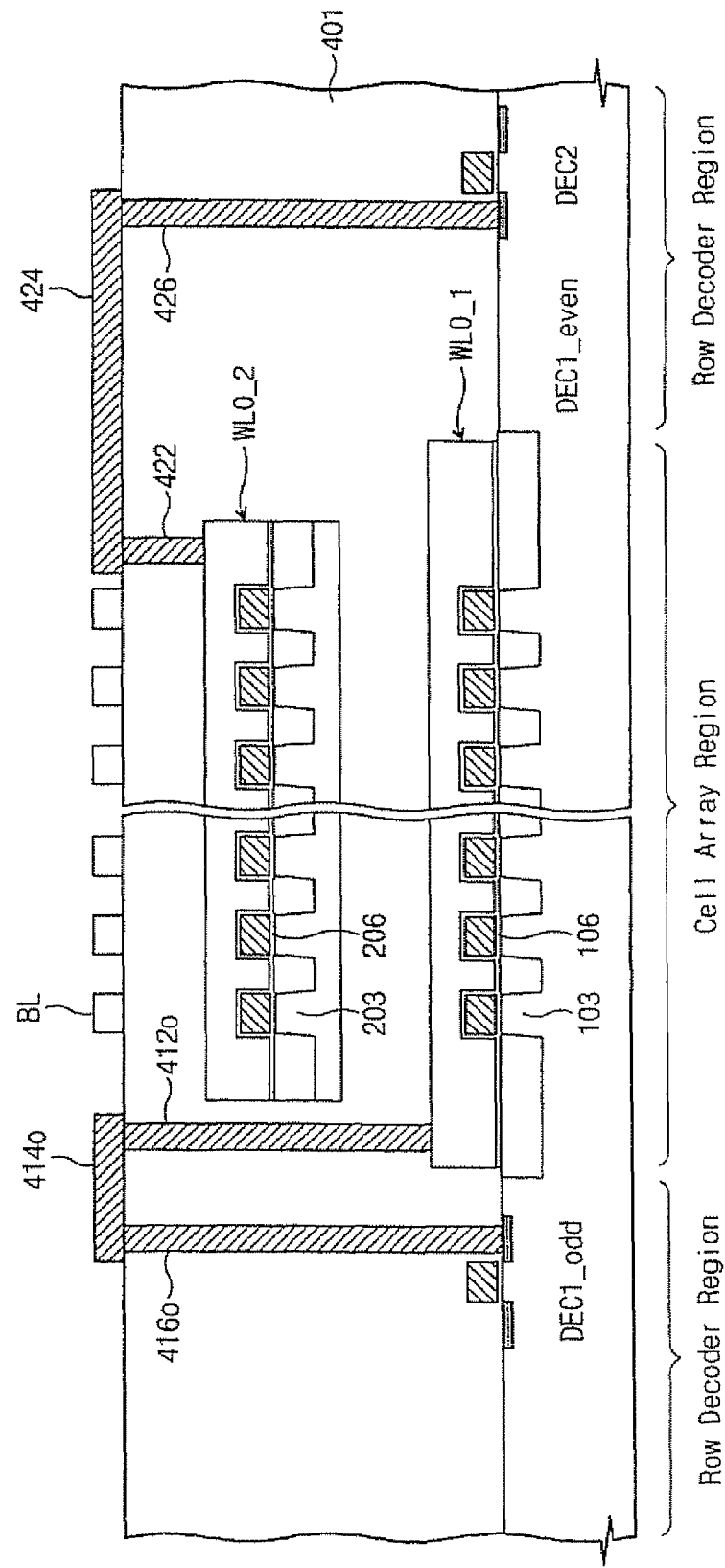

Referring to FIGS. 13A and 13B, first odd row decoder DEC1_odd and first even row decoder DEC1_even may be provided on opposite sides of the cell array region, and second odd row decoder DEC2_odd and second even row decoder DEC2_even may be disposed on a same side of the cell array region.

First even word line WLeven_1 may be connected to first even row decoder DEC1_even through first even wiring, and first odd word line WLodd_1 may be connected to first odd row decoder DEC1_odd through first odd wiring. Second word lines WLi_2 may be connected to second row decoder DEC2 through second wirings.

First even wiring may include first even word line contact 412*e* connected to first even word line WLeven_1, first even metal pattern 414*e* connected to first even word line contact 412*e*, and first even decoder contact 416*e* connecting first even metal pattern 414*e* with first even row decoder DEC1_even. First odd wiring may include first odd word line contact 412*o* connected to first odd word line WLodd_1, first odd metal pattern 414*o* connected to first odd word line contact 412*o*, and first odd decoder contact 416*o* connecting first odd metal pattern 414*o* with first odd row decoder DEC1_odd. Each second wiring may include second word line contact 422 connected to second word line WLi_2, second metal pattern 424 connected to second word line contact 422, and second decoder contact 426 connecting second metal pattern 424 with second row decoder DEC2. First even word line contacts 412*e* may be provided on one side of the cell array region, and first odd word line contacts 412*o* may be provided on an opposite side of the cell array region. Second word line contacts 422 and first even word line contacts 412*e* may be provided on one side of the cell array region.

Figure 14A:
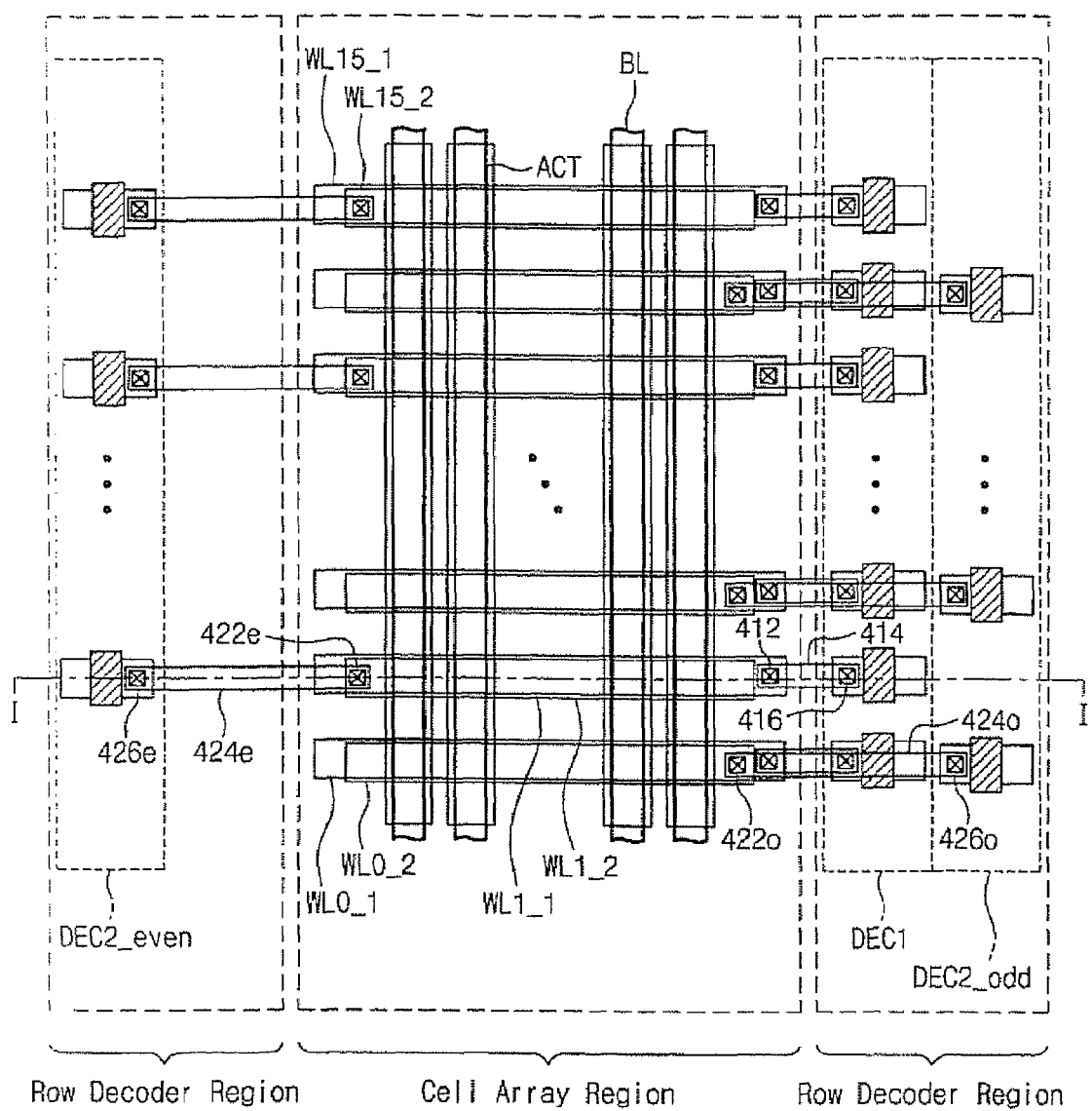
Figure 14B:
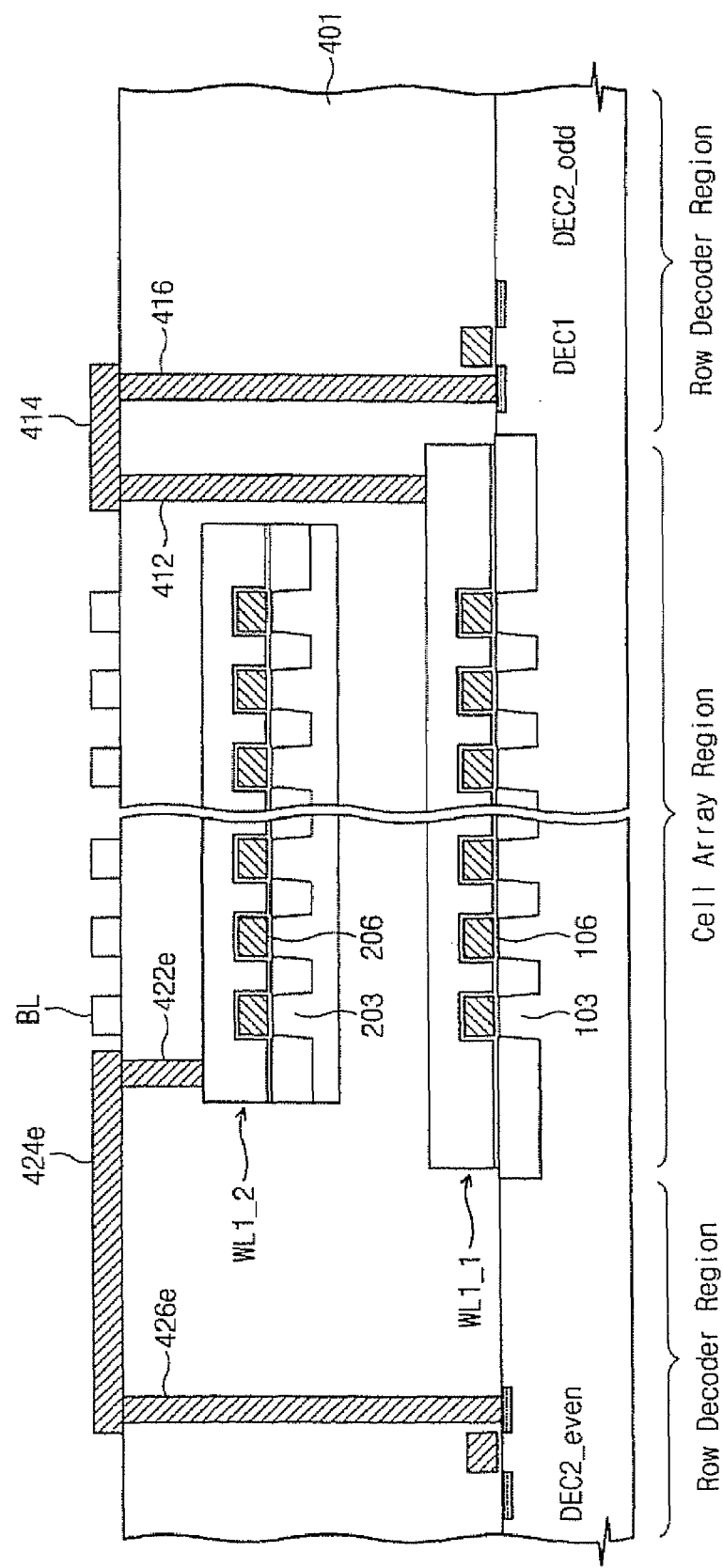

Referring to FIGS. 14A and 14B, first row decoder DEC1 and second odd row decoder DEC2_odd may be provided on a same side of the cell array region, and second odd row decoder DEC2_odd and second even row decoder DEC2_even may be provided on opposite sides of the cell array region.

First word line WLi_1 may be connected to first row decoder DEC1 through first wiring. Second even word line WLeven_2 may be connected to second even row decoder DEC2_even through second even wiring, and second odd word line WLodd_2 may be connected to second odd row decoder DEC2_odd through second odd wiring.

First wiring may include first word line contact 412 connected to first word line WLi_1, first metal pattern 414 connected to first word line contact 412, and first decoder contact 416 connecting first metal pattern 414 with first row decoder DEC1. Second even wiring may include first even word line contact 422*e* connected to second even word line WLeven_2, second even metal pattern 424*e* connected to second even word line contact 422*e*, and second even decoder contact 426*e* connecting second even metal pattern 424*e* with second even row decoder DEC2_even. Second odd wiring may include an first odd word line contact 422*o* connected to second odd word line WLodd_2, second odd metal pattern 424*o* connected to second odd word line contact 422*e*, and second odd decoder contact 426*o* connecting second odd metal pattern 424*o* with second odd row decoder DEC2_odd. Second even word line contact 422*e* may be provided on one side of the cell array region, and second odd word line contact 422*o* may be provided on the opposite side of the cell array region. First word line contact 412 may be provided on one side of the cell array region.

Figure 15A:
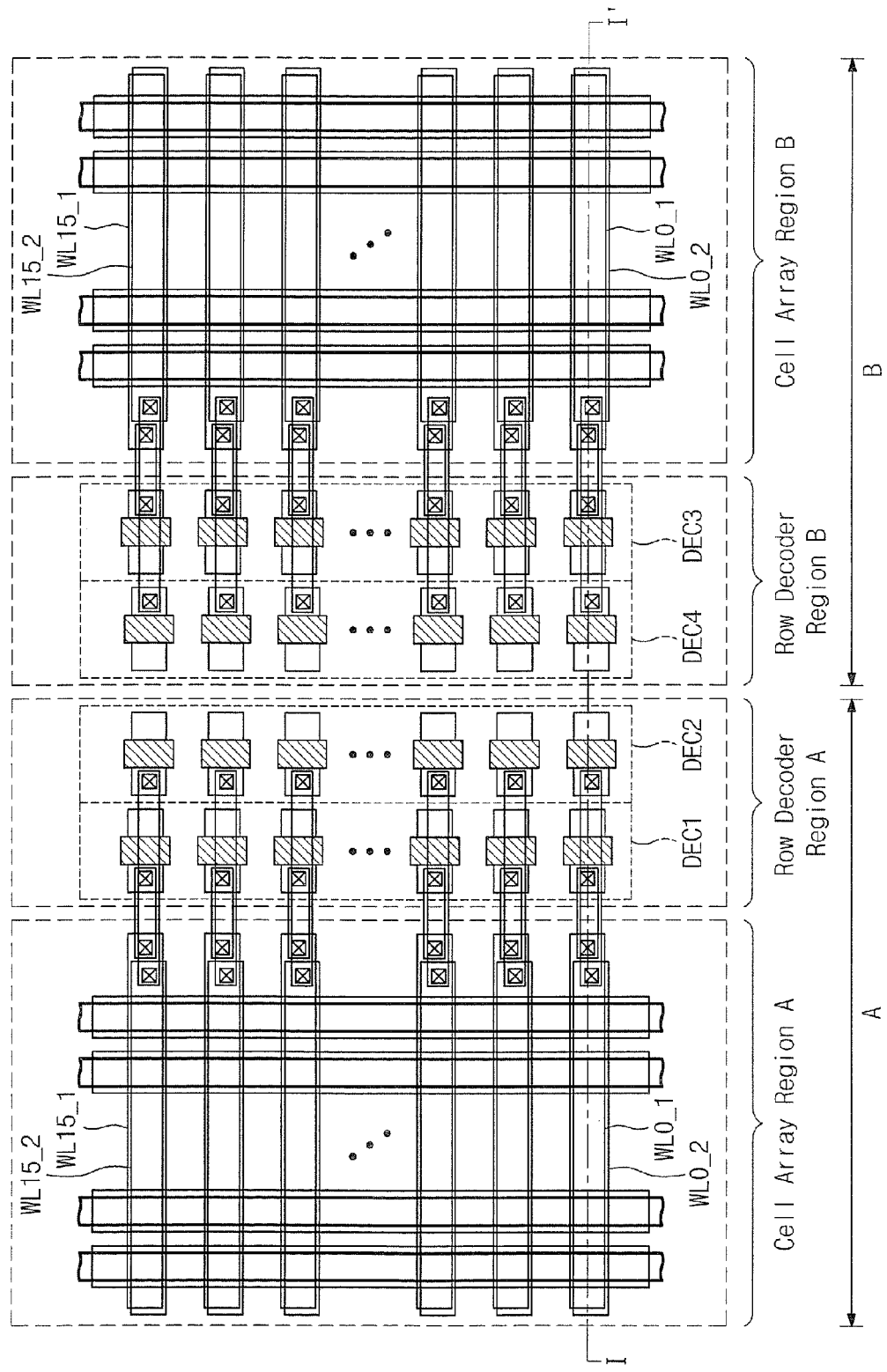
FIGS. 15A, 16A, and 17A are views of layouts of semiconductor devices with three-dimensional structures according to some embodiments of the present invention.

FIG. 15A is a view when a region A and a region B are adjacently arranged in parallel, and FIG. 15B is a cross-sectional view taken along section line I-I' of FIG. 15A. Region A may include cell array region A and row decoder region A adjacent to cell array region A. Cell array region A may include first cell block 100 with first gate lines WLi_1 at first layer, and second cell block 200 with second gate lines WLi_2 at a second layer above the first layer. Row decoder region A may include first row decoder DEC1 controlling first gate lines, and a second row decoder DEC2 controlling second gate lines. Region B may include cell array region B and row decoder region B adjacent to cell array region B. Cell array region B may include third cell block 300 with third gate lines WLi_1 at first layer, and fourth cell block 400 with fourth gate line WLi_2 at a second layer above the first layer. Row decoder region B may include third row decoder DEC3 controlling third gate lines and fourth row decoder DEC4 controlling fourth gate lines. Cell array region B may be spaced apart from cell array region A due to row decoder regions A and B.

Figure 16A:
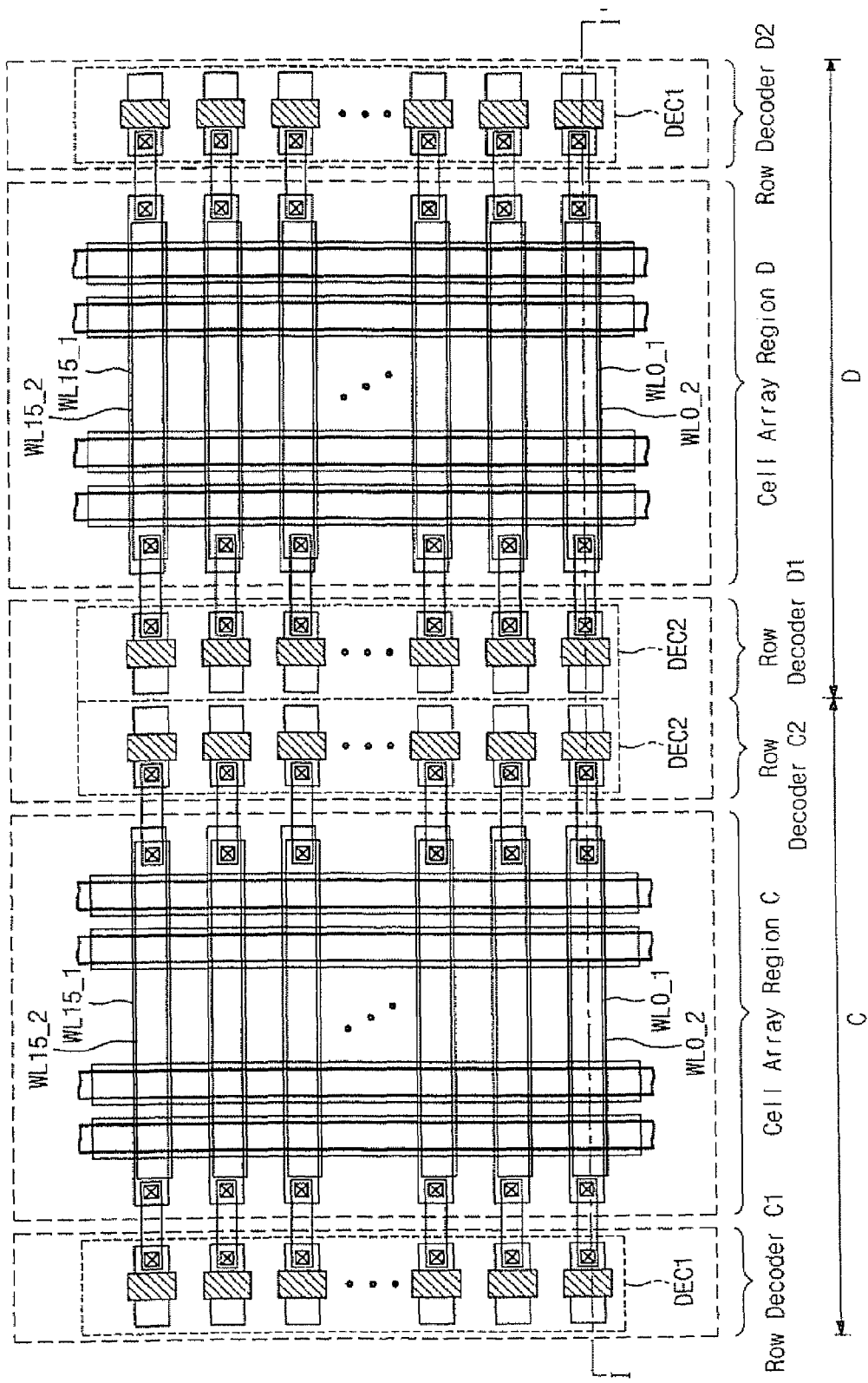

FIG. 16A is view when region C and region D with a structure symmetric to that of region C are adjacently arranged in parallel, and FIG. 16B is a cross-sectional view taken along section line I-I' of FIG. 16A. Region C may include cell array region C, and row decoder region C1 and row decoder region C2 on opposite sides of cell array region C. Cell array region C may include first cell block 100 with first gate line WLi_1 at first layer, and second cell block 200 with second gate line WLi_2 at a second layer above the first layer. Row decoder region C1 may include first row decoder DEC1 controlling a first gate line, and second row decoder DEC2 controlling a second gate line. Region D may include cell array region D, and row decoder region D1 and row decoder region D2 on opposite sides of cell array region D. Cell array region D may include third cell block 300 with third gate line WLi_1 at first layer, and fourth cell block 400 with fourth gate line WLi_2 at second layer above first layer. Row decoder region D1 may include second row decoder DEC2 controlling second gate lines, and row decoder region D2 may include first row decoder DEC1 controlling first gate lines.

Row decoder region C2 and row decoder region D1 may be adjacent to each other, and row decoder region C1 and row decoder region D2 may be on opposite sides of the cell array regions C and D. Cell array region D may be spaced apart from cell array region C due to row decoder region C1 and row decoder region D2. Other cell array regions (not shown) may be spaced apart from cell array region C or cell array region D due to row decoder region C2 and/or row decoder region D1.

Figure 17A:
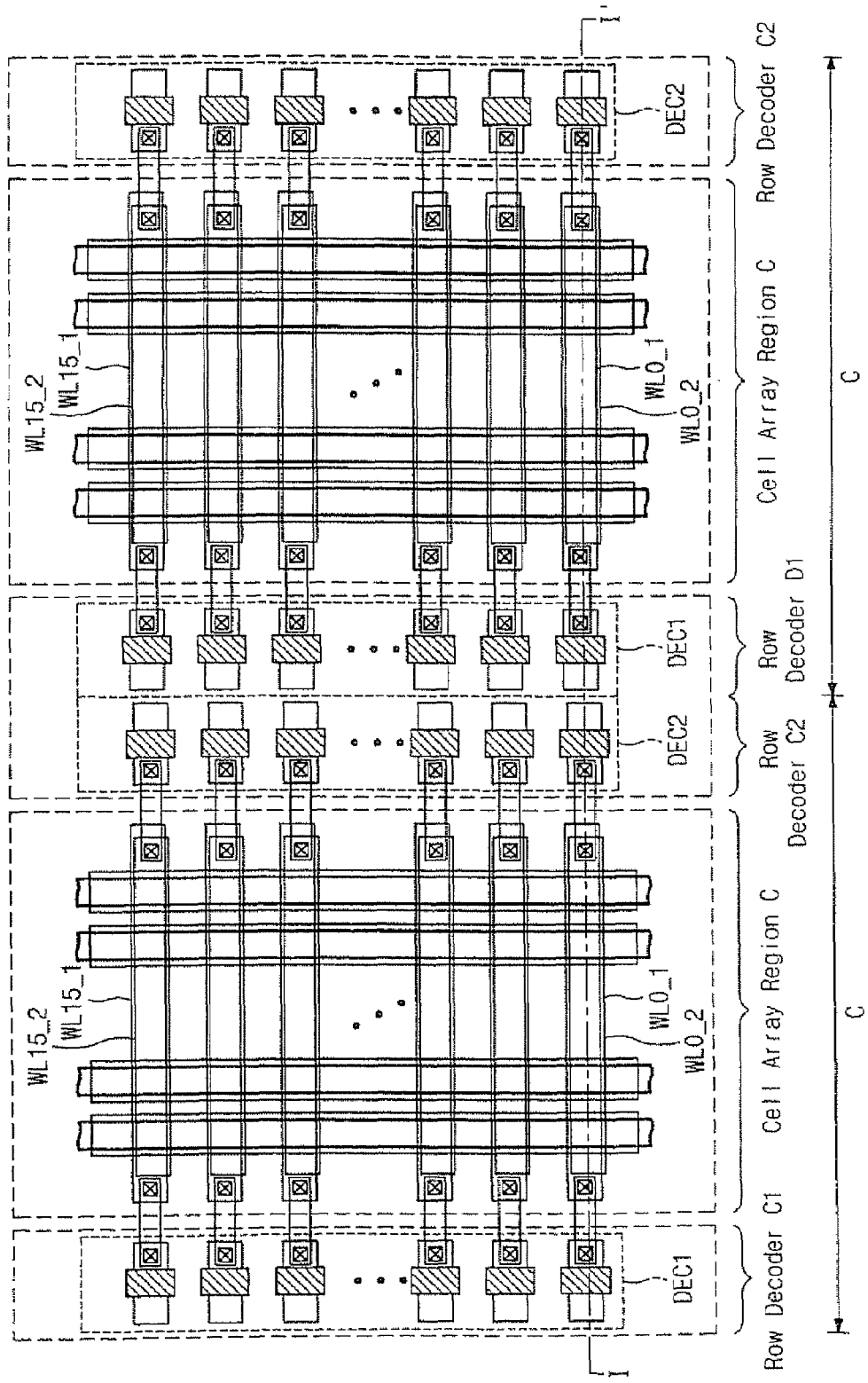
Figure 17B:
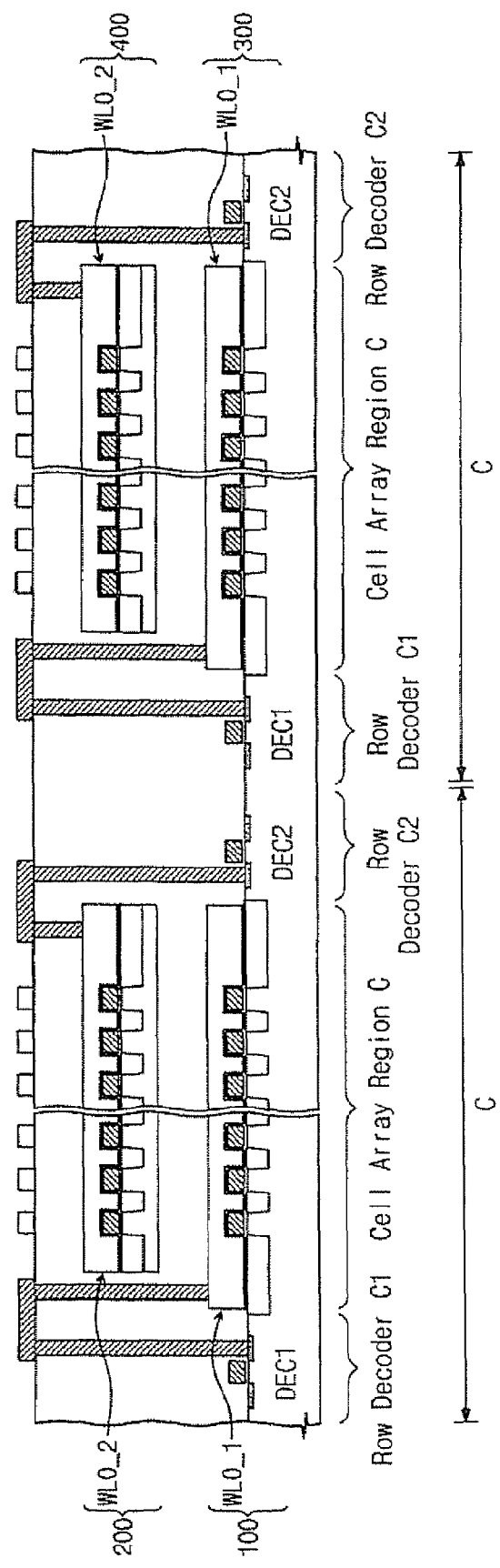

FIG. 17A is a view when region C of FIG. 6 is repeatedly arranged, and FIG. 17B is a cross-sectional view taken along section line I-I' of FIG. 17A. Region C includes cell array region C, and row decoder C1 and row decoder C2 on both sides of cell array region C.

Embodiments of the present invention described with reference to the drawings include structures discussed herein and/or combinations thereof.

Figure 18:
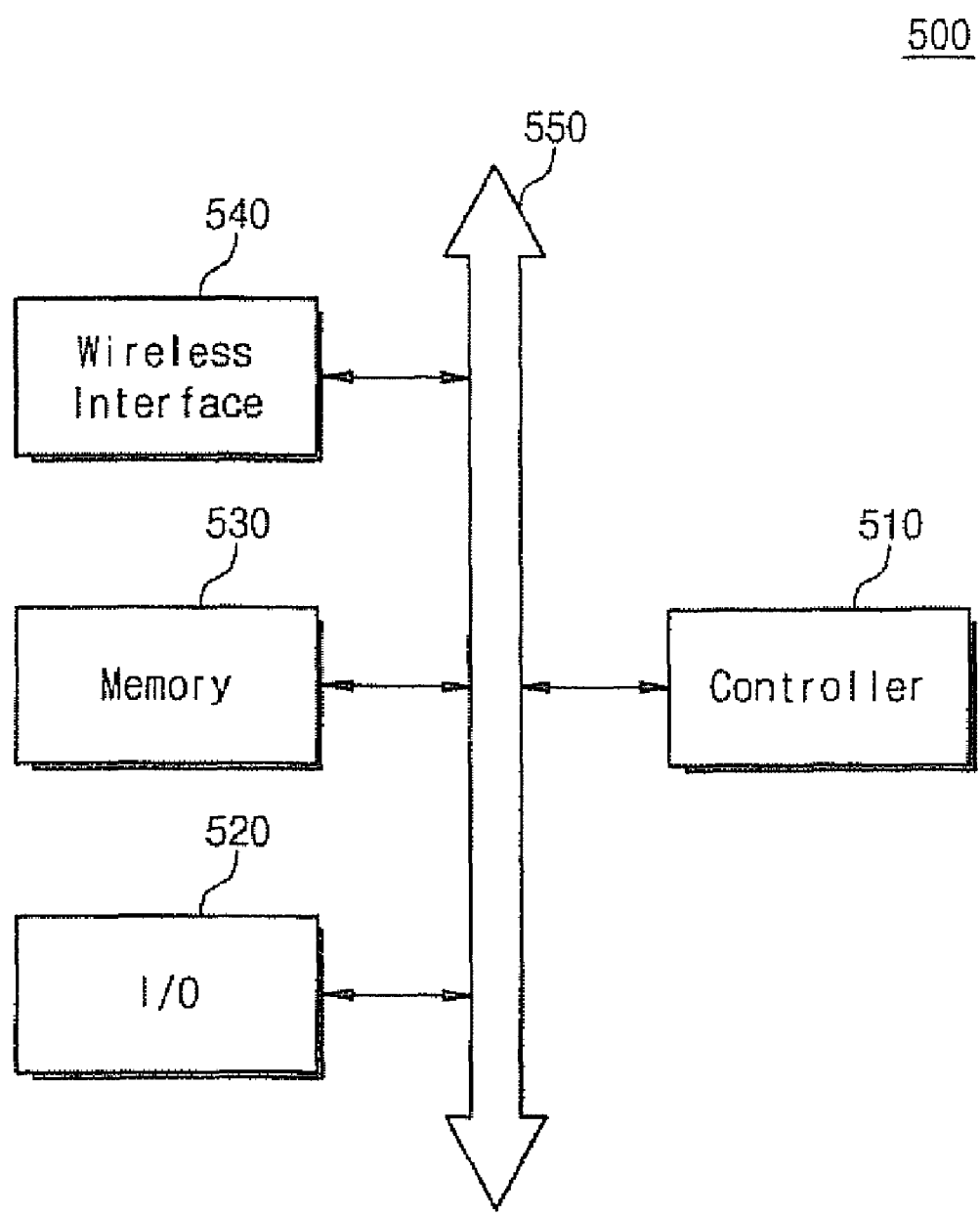
FIG. 18 is a block diagram of an electronic device including a semiconductor device with a three-dimensional structure according to some embodiments of the present invention.

Referring to FIG. 18, electronic device 500 may include a semiconductor device according to embodiments of the present invention. Electronic device 500 may be used in wireless communication devices such as PDAs, laptop computers, portable computers, web tablets, wireless telephones, mobile phones, digital music players, and all devices receiving and transmitting information in a wireless environment.

Electronic device 500 may include a controller 510, input/output device 520, memory 530, and wireless interface 540, which are connected through bus 550. Controller 510 may include at least one microprocessor, a digital signal processor, a microcontroller, and/or similar devices. Input/output device 520 may include keypads, keyboards, and/or displays. Memory 530 may be used to store commands executed by controller 510. Memory 530 may be used to store user data. Memory 530 may include a semiconductor memory device with a three-dimensional array structure according to embodiments of the present invention discussed above. Memory 530 may further include various other types of memories.

Electronic device 500 may use wireless interface 540 to transmit and/or receive data through a wireless communication network using an RF signal. For example, wireless interface 540 may include an antenna, a wireless transceiver, etc.

Electronic device 500 according to embodiments of the present invention may use communication interface protocols of a third generation wireless communication system such as CDMA, GSM, NADC, E-TDMA, WCDAM, CDMA2000, etc.

According to embodiments of the present invention, word lines in various layers may be conveniently handled. Due to row decoders on both sides of the cell array region, a margin of a metal contact and a metal line can be sufficiently obtained, and the metal contact and the metal line may be simultaneously formed. Moreover, since one row decoder may share the word lines in various layers, chip size can be reduced.

Accordingly, a nonvolatile memory device may be formed in a stacked structure and/or greater integration density may be provided.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. A semiconductor memory device comprising:
a memory cell array including first and second memory cell blocks on respective first and second semiconductor layers, wherein the first memory cell block includes a first plurality of word lines on the first semiconductor layer including a first word line of the first plurality coupled to a first row of memory cells on the first semiconductor layer, wherein the second memory cell block includes a second plurality of word lines on the second semiconductor layer including a second word line of the second plurality coupled to a second row of memory cells on the second semiconductor layer, wherein the first plurality of word lines including the first word line is between the first and second semiconductor layers, and wherein the second semiconductor layer is between the first plurality of word lines and the second plurality of word lines;
a first row decoder adjacent the memory cell array wherein the first row decoder is configured to control the first word line;
a second row decoder adjacent the memory cell array wherein the second row decoder is configured to control the second word line;
a first wiring electrically connecting the first row decoder and the first word line, the first wiring including a first word line contact electrically contacting the first word line in a direction perpendicular with respect to the first semiconductor layer, a first metal line electrically connected to the first word line contact in a direction parallel with respect to the first semiconductor layer, and a first decoder contact electrically connected between the first metal line and the first decoder in a direction perpendicular with respect to the first semiconductor layer;
a second wiring electrically connecting the second row decoder and the second word line; and
an insulating layer on the second semiconductor layer and on the second word line wherein the second semiconductor layer is between the first semiconductor layer and the insulating layer,
wherein the first metal line is disposed on the insulating layer so that the insulating layer is between the first metal line and the first row decoder.

2. A semiconductor memory device according to claim 1 wherein the first and second row decoders are provided on a same side of the memory cell array.

3. A semiconductor memory device according to claim 1,
wherein the second wiring includes a second word line contact electrically contacting the second word line in a direction perpendicular with respect to the second semiconductor layer, a second metal line electrically connected to the second word line contact in a direction parallel with respect to the second semiconductor layer, and a second decoder contact electrically connected between the second metal line and the second decoder in a direction perpendicular with respect to the second semiconductor layer,
wheren the second metal line is disposed on the insulating layer so that the insulating layer is between the second metal line and the second row decoder.

4. A semiconductor memory device according to claim 3 further comprising:
a bit line on the insulating layer so that the insulating layer is between the bit line and the second semiconductor layer;
wherein at least one of the first and/or second metal lines is on a same side of the insulating layer as the bit line and wherein the at least one of the first and/or second metal lines and the bit line have a same thickness.

5. A semiconductor memory device according to claim 3 wherein the first and second word line contacts are provided on a same side of the memory cell array.

6. A semiconductor memory device according to claim 3 wherein the first and second word line contacts are provided on opposite sides of the memory cell array.

7. A semiconductor memory device according to claim 3 wherein the first metal line is between a portion of the second metal line and a portion of the second word line.

8. A semiconductor memory device according to claim 3 wherein the memory cell array further includes a third memory cell block on a third semiconductor layer with the second semiconductor layer between the first and third semiconductor layers, wherein the third memory cell block includes a third word line coupled to a third row of memory cells on the third semiconductor layer, and wherein the third word line is electrically coupled with the second word line and the second decoder through the second word line contact.

9. A semiconductor memory device according to claim 3 further comprising:
a bit line commonly coupled to the first memory cell block on the first semiconductor layer and the second memory cell block on the second semiconductor layer.

10. A semiconductor memory device according to claim 1 wherein the memory cell array further includes a third memory cell block on a third semiconductor layer spaced apart from the first and second semiconductor layers, wherein the third memory cell block includes a third word line coupled to a third row of memory cells on the third semiconductor layer, the semiconductor memory device further comprising:
a third row decoder configured to control the third word line, wherein the memory cell array is between the third row decoder and at least one of the first and/or second row decoders; and
a third wiring electrically connecting the third row decoder and the third word line.

11. A semiconductor memory device according to claim 1 further comprising:
a second memory cell array including third and fourth memory cell blocks on respective third and fourth semiconductor layers, wherein the third memory cell block includes a third word line coupled to a third row of memory cells on the third semiconductor layer, wherein the fourth memory cell block includes a fourth word line coupled to a fourth row of memory cells on the fourth semiconductor layer, wherein the third word line is between the third and fourth semiconductor layers, and wherein at least one of the first and/or second row decoders is between the first and second memory cell arrays.

12. A semiconductor memory device according to claim 11 further comprising:
a third row decoder adjacent the second memory cell array wherein the third row decoder is configured to control the third word line;
a fourth row decoder adjacent the second memory cell array wherein the second row decoder is configured to control the fourth word line, wherein at least one of the third and/or fourth row decoders is between the first and second memory cell arrays;
a third wiring electrically connecting the third row decoder and the third word line; and
a fourth wiring electrically connecting the fourth row decoder and the fourth word line.

13. A semiconductor memory device according to claim 12 wherein the first, second, third, and fourth row decoders are between the first and second memory cell arrays.

14. A semiconductor memory device according to claim 12 wherein the first and second row decoders are between the first and second memory cell arrays, and wherein the second memory cell array is between the first and second row decoders and the third and fourth row decoders.

15. A semiconductor memory device according to claim 1 wherein the memory cell array is between the first and second row decoders.

16. A semiconductor memory device according to claim 15 wherein the first memory cell block further includes a third word line coupled to a third row of memory cells on the first semiconductor layer, wherein the second memory cell block further includes a fourth word line coupled to a fourth row of memory cells on the second semiconductor layer, wherein the first row decoder comprises a first odd row decoder configured to control the first word line and a first even row decoder configured to control the third word line, and wherein the second row decoder comprises a second odd row decoder configured to control the second word line and a second even row decoder configured to control the fourth word line.

17. A semiconductor memory device according to claim 16 wherein the memory cell array is between the first odd and even row decoders and wherein the memory cell array is between the second odd and even row decoders.

18. A semiconductor memory device according to claim 17 wherein the first even row decoder and the second odd row decoder are on a same side of the memory cell array, and wherein the first odd row decoder and the second even row decoder are on a same side of the memory cell array.

19. A semiconductor memory device according to claim 1 wherein the first row decoder includes at least one transistor having portions thereof in the first semiconductor layer, and wherein the second row decoder includes at least one transistor having portions thereof in the first semiconductor layer.

20. A semiconductor memory device according to claim 1 wherein the first row decoder includes at least one first transistor, wherein the second row decoder includes at least one second transistor, wherein portions of the at least one first transistor and portions of the at least one second transistor are in different spaced apart semiconductor layers.

21. A semiconductor memory device according to claim 1 wherein each memory cell comprises a flash non-volatile memory cell transistor including a charge trapping layer between the respective word line and the respective semiconductor layer and a tunnel insulating layer between the charge trapping layer and the respective semiconductor layer.

22. A semiconductor memory device according to claim 1 wherein each memory cell of a respective row comprises one of a plurality of serially coupled memory cells in a different string of a NAND configuration.

23. A semiconductor memory device comprising:
a memory cell array including a memory cell block, wherein the memory cell block includes a first word line on a first semiconductor layer wherein the first word line is coupled to a first row of memory cells and a second word line coupled on a second semiconductor layer wherein the second word line is coupled to a second row of memory cells, and wherein the first word line is between the first and second semiconductor layers;
an odd row decoder adjacent the memory cell array wherein the odd row decoder is configured to control the first word line;
an even row decoder adjacent the memory cell array wherein the even row decoder is configured to control the second word line wherein the memory cell array is between the odd and even row decoders;
a first wiring electrically connecting the odd row decoder and the first word line; and
a second wiring electrically connecting the even row decoder and the second word line.

24. A semiconductor memory device comprising:
a memory cell array including first and second memory cell blocks on respective first and second semiconductor layers, wherein the first and second memory cell blocks include respective first and second pluralities of word lines, wherein the first plurality of word lines are coupled to respective first rows of memory cells on the first semiconductor layer, wherein the second pluralities of word lines are coupled to respective second rows of memory cells on the second semiconductor layer, and wherein the first word line is between the first and second semiconductor layers;
a row decoder adjacent the memory cell array wherein the row decoder is configured to control a first word line of the first plurality of word lines and a second word line of the second plurality of word lines; and
a wiring electrically connecting the first and second word lines and electrically connecting the first and second word lines with the row decoder.

* * * * *